(12) United States Patent
Wu et al.

(10) Patent No.: US 12,334,362 B2
(45) Date of Patent: Jun. 17, 2025

(54) PACKAGE STRUCTURE INCLUDING PHOTONIC PACKAGE HAVING EMBEDDED OPTICAL GLUE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 310 days.

(21) Appl. No.: 18/150,557

(22) Filed: Jan. 5, 2023

(65) Prior Publication Data

US 2023/0377907 A1 Nov. 23, 2023

Related U.S. Application Data

(60) Provisional application No. 63/405,965, filed on Sep. 13, 2022, provisional application No. 63/365,136, filed on May 23, 2022.

(51) Int. Cl.
*H01L 21/56* (2006.01)
*G02B 6/12* (2006.01)
*H01L 21/683* (2006.01)
*H01L 23/538* (2006.01)

(52) U.S. Cl.
CPC ........ *H01L 21/565* (2013.01); *G02B 6/12004* (2013.01); *H01L 21/6835* (2013.01); *H01L 23/5389* (2013.01); *G02B 2006/12147* (2013.01); *H01L 2221/68345* (2013.01)

(58) Field of Classification Search
CPC .. H01L 21/565; H01L 21/566; H01L 23/5389
See application file for complete search history.

(56) References Cited

U.S. PATENT DOCUMENTS

| | | | | |
|---|---|---|---|---|
| 11,437,527 B2 * | 9/2022 | Saxod | ................... | G01S 7/4813 |
| 11,796,735 B2 * | 10/2023 | Yu | ........................... | G02B 6/136 |
| 11,841,541 B2 * | 12/2023 | Chang | ................ | H01L 23/5383 |
| 12,044,892 B2 * | 7/2024 | Yu | ........................ | G02B 6/4274 |
| 12,085,769 B2 * | 9/2024 | Chen | ..................... | H01L 21/568 |
| 2009/0129422 A1 * | 5/2009 | Edris | ...................... | H01L 24/81 |
| | | | | 257/434 |
| 2023/0377907 A1 * | 11/2023 | Wu | ........................ | H01L 25/50 |

\* cited by examiner

*Primary Examiner* — Rhonda S Peace
(74) *Attorney, Agent, or Firm* — Slater Matsil, LLP

(57) ABSTRACT

A method of forming a semiconductor package includes: bonding a first wafer to a second wafer, where the first wafer includes a plurality of electronic dies, and the second wafer includes a plurality of photonic dies; after bonding the first wafer, forming trenches in the second wafer between adjacent ones of the plurality of photonic dies; filling the trenches with an optical glue; and dicing the first wafer and the second wafer to form a plurality of photonic packages, where a photonic package of the plurality of photonic packages includes an electronic die, a photonic die bonded to the electronic die, and the optical glue, where the optical glue extends along a sidewall of the photonic package.

20 Claims, 21 Drawing Sheets

PACKAGE STRUCTURE INCLUDING PHOTONIC PACKAGE HAVING EMBEDDED OPTICAL GLUE

PRIORITY CLAIM AND CROSS-REFERENCE

This application claims the benefits of U.S. Provisional Application No. 63/365,136, filed on May 23, 2022 and U.S. Provisional Application No. 63/405,965, filed Sep. 13, 2022, which applications are hereby incorporated herein by reference in their entireties.

BACKGROUND

Electrical signaling and processing are one type of technique for signal transmission and processing. Optical signaling and processing have been used in increasingly more applications in recent years, particularly due to the use of optical fiber-related applications for signal transmission.

Optical signaling and processing may be combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical dies (also referred to as photonic dies) including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
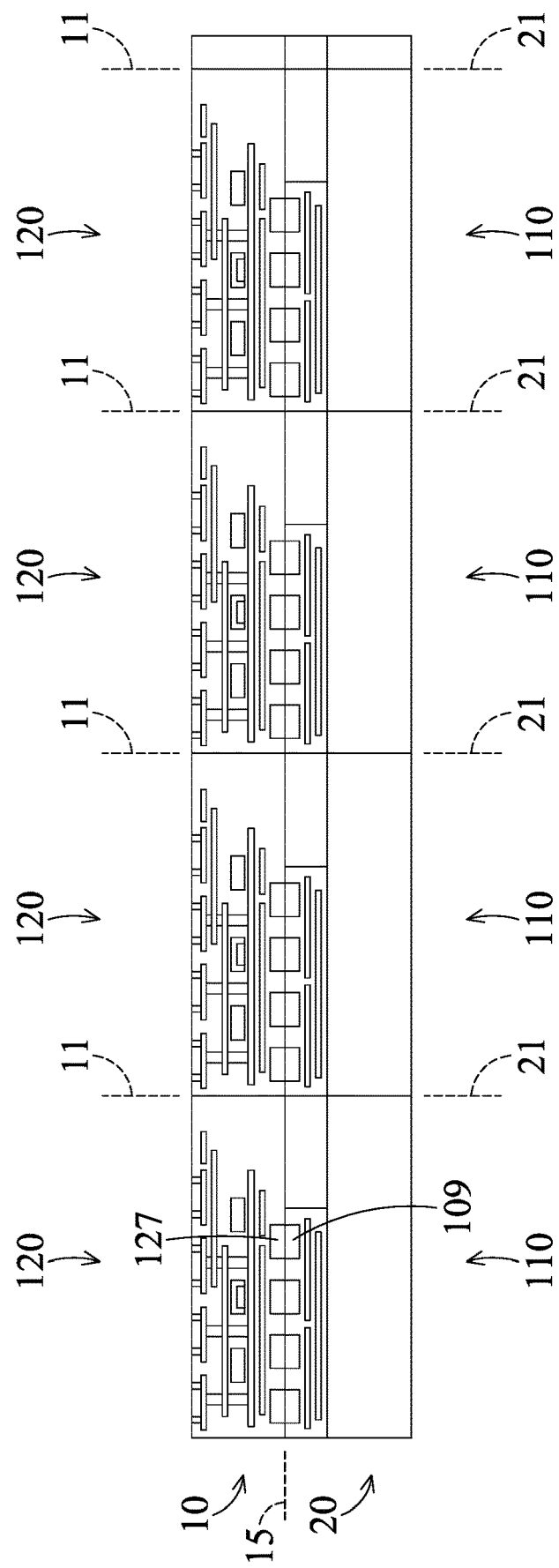
FIGS. 1 through 6 illustrate cross-sectional views of a photonic package at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

In some embodiments, a photonic package is formed by bonding a photonic die to an electronic die, and replacing a portion of the dielectric layers of the photonic die with an optical glue. An edge coupler of the photonic die is proximate to the optical glue. An exterior sidewall of the optical glue is flush with a sidewall of the photonic package and is exposed, which allow for easy attachment of an optical fiber on the exterior sidewall of the optical glue to achieve optical coupling to the edge coupler. In some embodiments, the photonic package is embedded in a molding material with another die, and a redistribution structure is formed over the molding material. A dicing process is performed next to remove portions of the molding material to expose the exterior sidewall of the optical glue. Next, the redistribution structure is attached to a substrate, and an underfill material is formed between the redistribution structure and the substrate. The substrate has a trench formed at a topmost dielectric layer facing the redistribution structure. The trench is disposed adjacent to the optical glue, and portions of the underfill material flow into the trench, which ensures that the underfill material does not cover the exterior sidewall of the optical glue. The exposed exterior sidewall of the optical glue allows for optical coupling between a side mounted optical component (e.g., an optical fiber) and the edge coupler. The disclosed structures, by integrating both photonic dies and electronic dies in a same package, allows for co-package optics (CPO) integration, and achieves high bandwidth with ultra-low power consumption.

FIGS. 1 through 6 illustrate cross-sectional views of a photonic package 100 at various stages of manufacturing, in accordance with an embodiment.

Referring to FIG. 1, a first side (e.g., the lower side of wafer 10 in FIG. 1) of a wafer 10 is attached (e.g., bonded) to a front side of a wafer 20. The wafer 10 includes a plurality of photonic dies 120 separated by dicing regions. Locations of the dicing regions of the wafer 10 are indicated by lines 11 in FIG. 1. The wafer 20 includes a plurality of electronic dies 110 separated by dicing regions. Locations of the dicing regions of the wafer 20 are indicated by lines 21 in FIG. 1. Note that for simplicity, not all details of the photonic dies 120 and electronic dies 110 are illustrated in all of the figures. Details of the photonic die 120 and the electronic die 110 are illustrated and discussed hereinafter with reference to FIG. 6.

The wafer 10 is bonded to the wafer 20 by a suitable bonding process, such as by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layer at the first side of the wafer 10 and the topmost dielectric layer at the front side of the wafer 20. During the bonding, metal bonding may also occur between die connectors 109 of the electronic die 110 and die connectors 127 of the photonic die 120. In the example of FIG. 1, dicing regions of the wafer 10 are aligned with respective dicing regions of the wafer 20 after the wafer bonding process.

Figure 2:
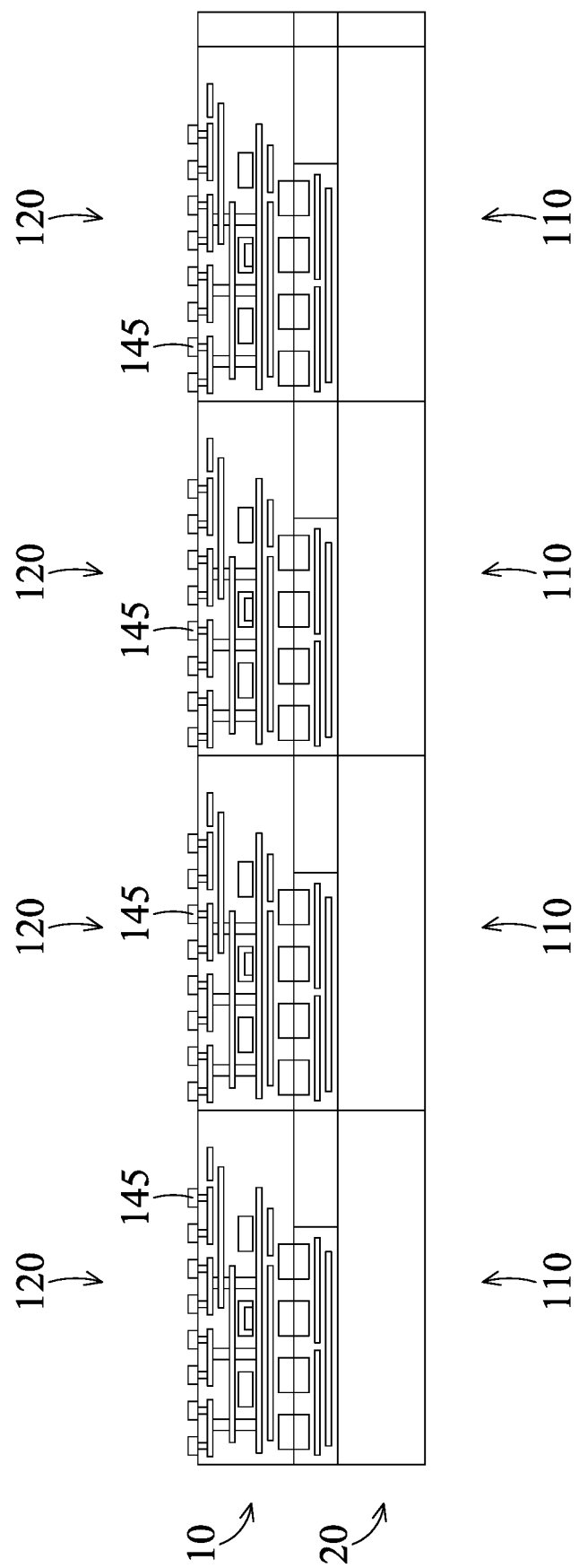

Next, in FIG. 2, conductive bumps 145 are formed on a second side (e.g., the upper side of wafer 10 in FIGS. 1 and 2) of the wafer 10 to electrically couple to conductive features (e.g., vias, or conductive pads) of the photonic dies 120. The conductive bumps 145, after a subsequent dicing process to form individual photonic packages 100, serve as the external connectors of the photonic package 100. The conductive bumps 145 may be any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

Figure 3:
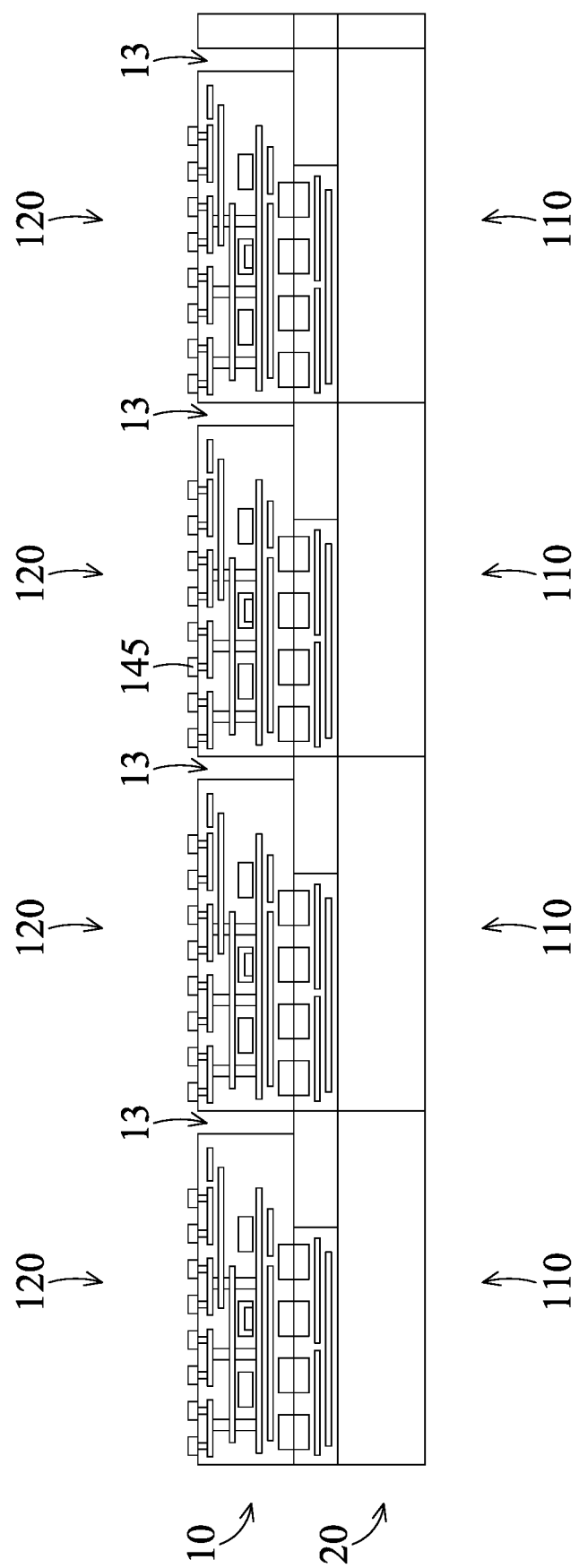

Next, in FIG. 3, trenches 13 (e.g., openings) are formed in the wafer 10 between adjacent photonic dies 120. For example, the trenches 13 may be formed along the dicing regions of the wafer 10. The trenches 13 may extend through the wafer 10 and expose the underlying wafer 20. In the example of FIG. 3, the bottom of the trench 13 is level with the lower surface of the wafer 10. In some embodiments, the bottom of the trench 13 may be formed to be slightly higher or slightly lower than the lower surface of the wafer 10.

The trenches 13 may be formed using any suitable method, such as etching (e.g., anisotropic etching), blade cutting, laser cutting, or the like. In the illustrated embodiments, each photonic die 120 has a respective trench 13 along one sidewall (e.g., the right sidewall in FIG. 3). The trenches 13 are formed in regions of photonic dies 120 without functional circuit, such that the trenches 13 do not impact the function of the photonic dies 120.

Figure 4:
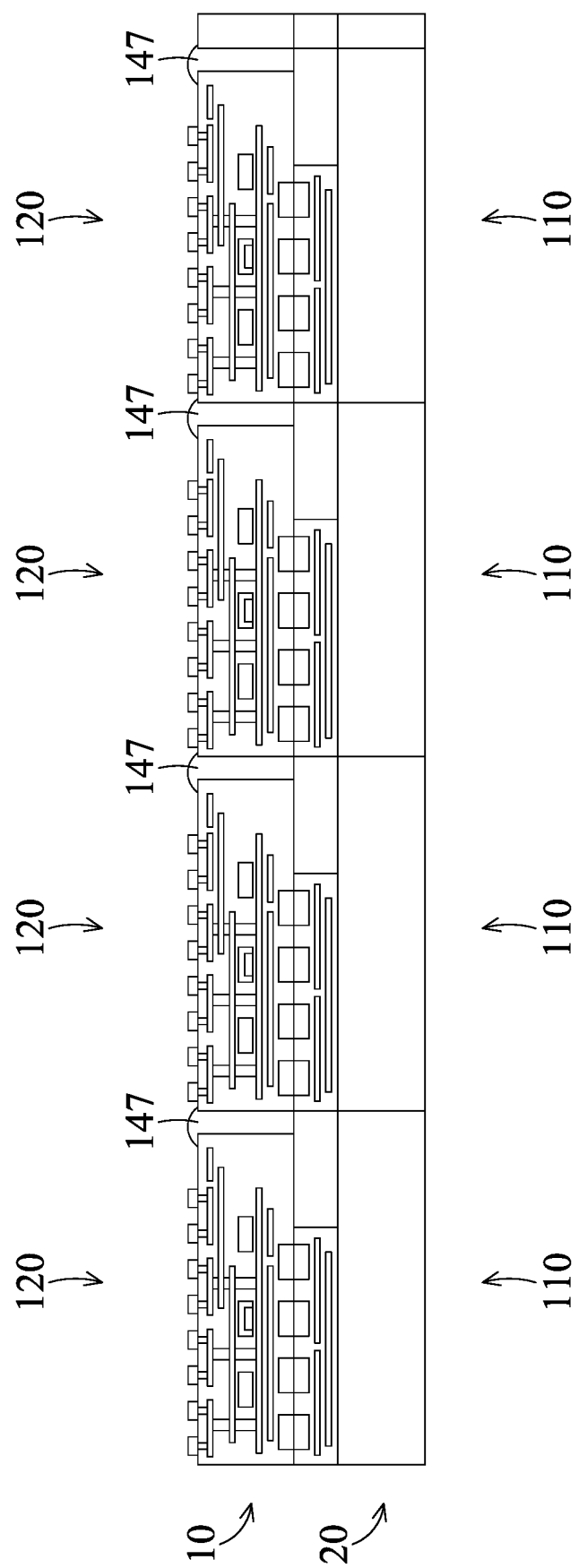

Next, in FIG. 4, an optical glue 147 is formed in the trenches 13. The optical glue 147 may fill or overfill the trenches 13. In some embodiments, the optical glue 147 is transparent to lights within a specified range of wavelengths, which lights are used to carry optical signals processed by the photonic die 120.

Figure 5:
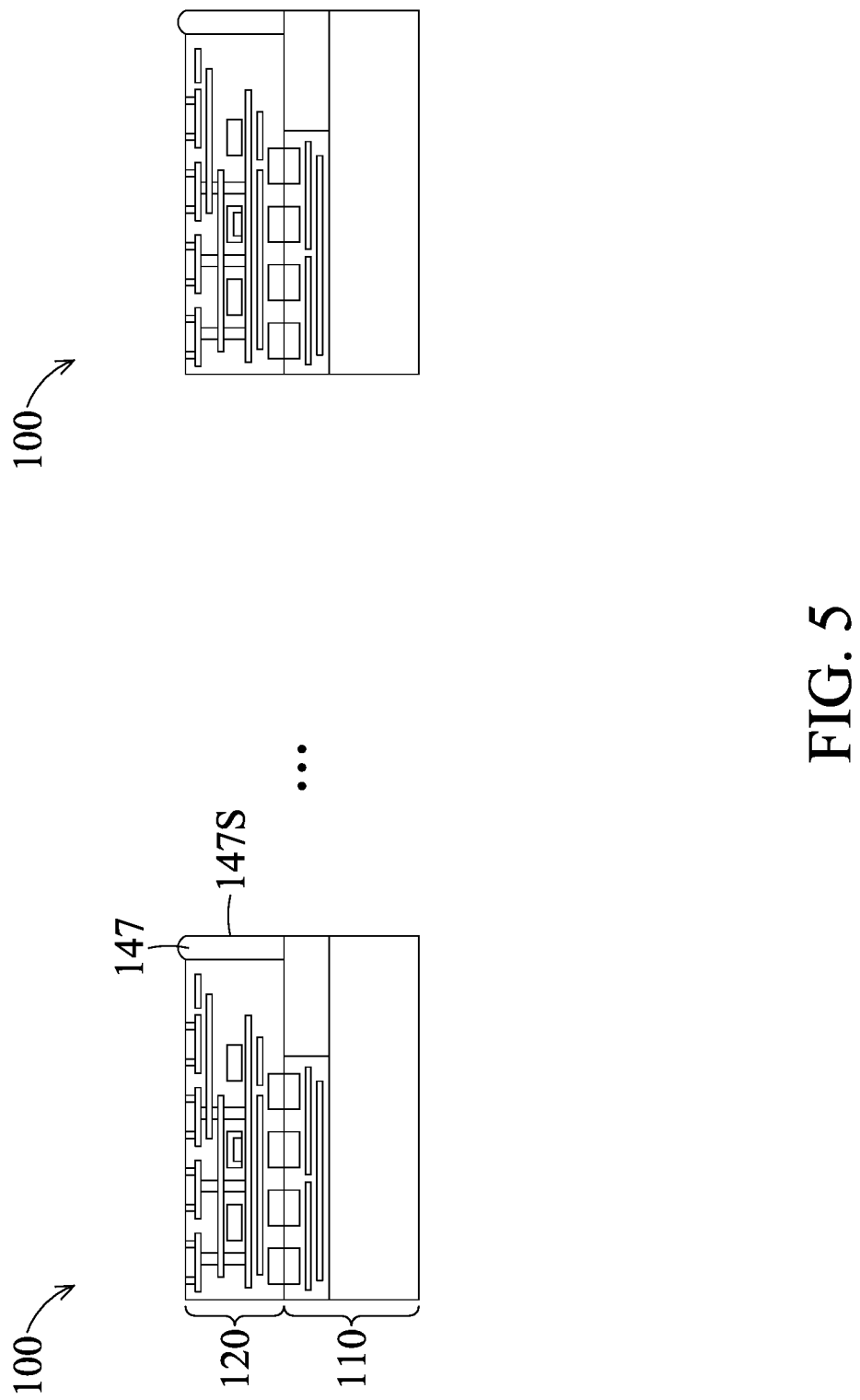

Next, in FIG. 5, a dicing process is performed along the dicing regions of the wafers 10 and 20 to produce a plurality of individual (e.g., separate) photonic packages 100, where each photonic package 100 includes a photonic die 120 attached (e.g., bonded) to an electronic die 110. The dicing process may be performed using a blade, or a laser cutting tool, as examples. The dicing is performed to cut through, or cut along, the optical glue 147, such that after the dicing process, the photonic die 120 in each photonic package 100 has the optical glue 147 embedded in the (e.g., dielectric layers of) the photonic die 120. Due to the straight dicing path of the dicing process, an exterior sidewall 147S of the optical glue 147 in the photonic package 100 is flush (e.g., vertically aligned) with a respective sidewall of the electronic die 110, in some embodiments. Note that the exterior sidewall 147S and the respective sidewall of the electronic die 110 comprise (part of) a sidewall (e.g., right sidewall in FIG. 5) of the photonic package 100. Details of the photonic package 100, which includes the photonic die 120, the electronic die 110, and the optical glue 147, are illustrated in FIG. 6.

Figure 6:
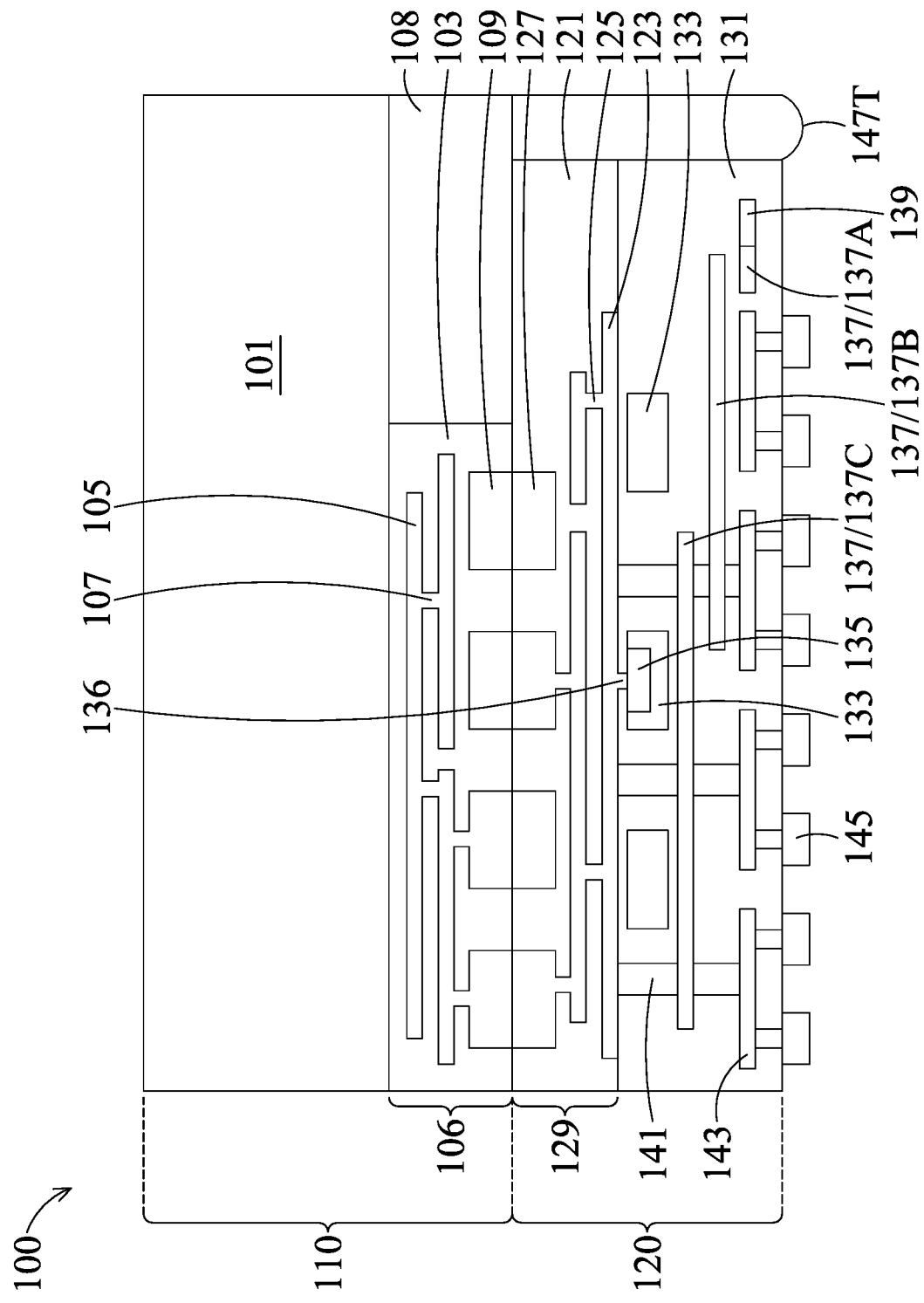

Referring now to FIG. 6, which shows details of the photonic package 100. Note that the photonic package 100 in FIG. 6 corresponds to the photonic package 100 in FIG. 5, but flipped upside down. In the example of FIG. 6, the photonic package 100 includes the electronic die 110 attached (e.g., bonded) to the photonic die 120, with the optical glue 147 embedded in the photonic die 120 and disposed along a sidewall of the photonic package 100.

The electronic die 110 may be, for example, semiconductor devices, dies, or chips that communicate with the photonic die 120 using electrical signals. In the illustrated embodiments, the electronic die 110 does not receive, transmit, or process optical signals. In the discussion herein, the term "electronic die" is used to distinguish from "photonic die" (e.g., 120), which refers to a die that can receive, transmit, or process optical signals, such as converting an optical signal into an electric signal, or vice versa. Besides optical signals, the photonic die 120 may also transmit, receive, or process electrical signals. One electronic die 110 is shown in FIG. 6, but the photonic package 100 may include two or more electronic dies 110 in other embodiments. In some cases, multiple electronic dies 110 may be incorporated into a single photonic package 100 in order to reduce processing cost.

In some embodiments, the electronic die 110 includes a substrate 101 (e.g., a semiconductor substrate such as silicon or the like). Electronic components, such as transistors, diodes, capacitors, resistors, etc., may be formed in and/or on the substrate 101 and may be interconnected by an interconnect structures 106 formed by, for example, metallization patterns (e.g., conductive lines 105 and vias 107) in one or more dielectric layers 103 over the substrate 101 to form an integrated circuit. The electronic die 110 further comprise pads (not illustrated), such as aluminum pads, to which external connections are made. The pads are on what may be referred to as the active side (or front side) of the electronic dies 110. One or more passivation layers are formed at the front side the electronic dies 110 and on portions of the pads. Die connectors 109, such as conductive pillars (for example, comprising a metal such as copper), are formed to extend through the passivation layer(s) and are mechanically and electrically coupled to the respective pads. The die connectors 109 are electrically coupled to the integrated circuits of the electronic die 110.

Note that in the example of FIG. 6, portions of the dielectric layers 103 of the electronic die 110, where no functional circuit is located, is replaced by a dielectric material 108. The dielectric material 108 may be a gap-fill material in some embodiments, which may include silicon oxide, silicon nitride, a polymer, the like, or a combination thereof. In some embodiments, the dielectric material 108 may be a material (e.g., silicon oxide) that is substantially transparent to light at wavelengths suitable for transmitting optical signals or optical power between optical components (e.g., a grating coupler) of the photonic die 120 and a vertically-mounted optical fiber (see, e.g., 185 in FIG. 13).

The electronic die 110 may include integrated circuits for interfacing with a photonic component 135 (e.g., a photodetector and/or a modulator) of the photonic die 120. The electronic die 110 may include circuits for controlling the operation of the photonic components 135. For example, the electronic die 110 may include controllers, drivers, transimpedance amplifiers, the like, or combinations thereof. The electronic die 110 may also include a central processing unit (CPU), in some embodiments. In some embodiments, the electronic die 110 includes circuits for processing electrical signals received from the photonic component 135 comprising a photodetector. The electronic die 110 may control high-frequency signaling of the photonic components 135 according to electrical signals (digital or analog) received from another device or die, in some embodiments. In some embodiments, the electronic die 110 may be an electronic integrated circuit (EIC) or the like that provides Serializer/Deserializer (SerDes) functionality. In this manner, the electronic die 110 may act as part of an I/O interface between optical signals and electrical signals within the photonic package 100. In some embodiments, the photonic packages 100 described herein could be considered system-on-chip (SoC) or system-on-integrated-circuit (SoIC) devices.

Still referring to FIG. 6, the photonic die 120 includes one or more dielectric layers 131, conductive features (e.g., conductive lines 143 and vias 141) formed in the dielectric layer 131, and various photonic devices formed in the dielectric layers 131, such as waveguides 133, photonic components 135, nitride waveguides 137 (e.g., 137A, 137B, and 137C), edge coupler 139, or the like. In addition, the photonic die 120 includes a redistribution structure 129 over the dielectric layers 131, and conductive bumps 145 under the dielectric layers 131.

In some embodiments, the waveguides 133 are silicon waveguides formed by patterning a silicon layer. One waveguide 133 or multiple waveguides 133 may be patterned from the silicon layer. If multiple waveguides 133 are formed, the multiple waveguides 133 may be individual separate waveguides 133 or connected as a single continuous structure. In some embodiments, one or more of the waveguides 133 form a continuous loop.

The photonic components 135 may be integrated with the waveguides 133, and may be formed with the waveguides 133. The photonic components 135 may be optically coupled to the waveguides 133 to interact with optical signals within the waveguides 133. The photonic components 135 may include, for example, photonic devices such as photodetectors and/or modulators. For example, a photodetector may be optically coupled to the waveguides 133 to detect optical signals within the waveguides 133 and generate electrical signals corresponding to the optical signals. A modulator may be optically coupled to the waveguides 133 to receive electrical signals and generate corresponding optical signals within the waveguides 133 by modulating optical power within the waveguides 133. In this manner, the photonic components 135 facilitate the input/output (I/O) of optical signals to and from the waveguides 133. In other embodiments, the photonic components 135 may include other active or passive components, such as laser diodes, optical signal splitters, or other types of photonic structures or devices. Optical power may be provided to the waveguides 133 by, for example, an optical fiber (see, e.g., 185 in FIG. 9A) coupled to an external light source. Contacts 136 (e.g., copper vias) are formed to electrically couple the photonic components 135 to the redistribution structure 129 of the photonic die 120.

Although not shown, one or more grating couplers may be integrated with the waveguides 133, and may be formed with the waveguides 133. The grating coupler is a photonic structure that allows optical signals and/or optical power to be transferred between the waveguide 133 and a photonic component such as a vertically-mounted optical fiber (see, e.g., optical fiber 185 in FIG. 13) or a waveguide of another photonic system.

FIG. 6 further illustrates a plurality of nitride waveguides 137 (e.g., 137A, 137B, and 137C) formed in different layers of the dielectric layers 131. The nitride waveguides 137 may be formed by patterning silicon nitride layers. One nitride waveguide 137 or multiple nitride waveguides 137 may be formed by patterning a silicon nitride layer. If multiple nitride waveguides 137 are formed, the multiple nitride waveguides 137 may be individual separate nitride waveguides 137 or connected as a single continuous structure. In some embodiments, one or more of the nitride waveguides 137 form a continuous loop. In some embodiments, nitride waveguides 137 may include photonic structures such as grating couplers, edge couplers 139, or couplers (e.g., mode converters) that allow optical signals to be transmitted between two nitride waveguides 137 and/or between a nitride waveguide 137 and a waveguide 133. In the example of FIG. 6, the nitride waveguide 137A includes an edge coupler 139 proximate to a sidewall of the photonic die 120 facing the optical glue 147. The edge coupler 139 allows optical signals and/or optical power to be transferred between the nitride waveguide 137A and an external photonic component (see, e.g., optical fiber 185 in FIG. 9A) that is horizontally mounted on a sidewall of the photonic package 100. In the discussion herein, the waveguides 133 (e.g., silicon waveguides) and the nitride waveguides 137 (e.g., silicon nitride waveguides) may be collectively referred to as waveguides 133/137.

Figure 9A:
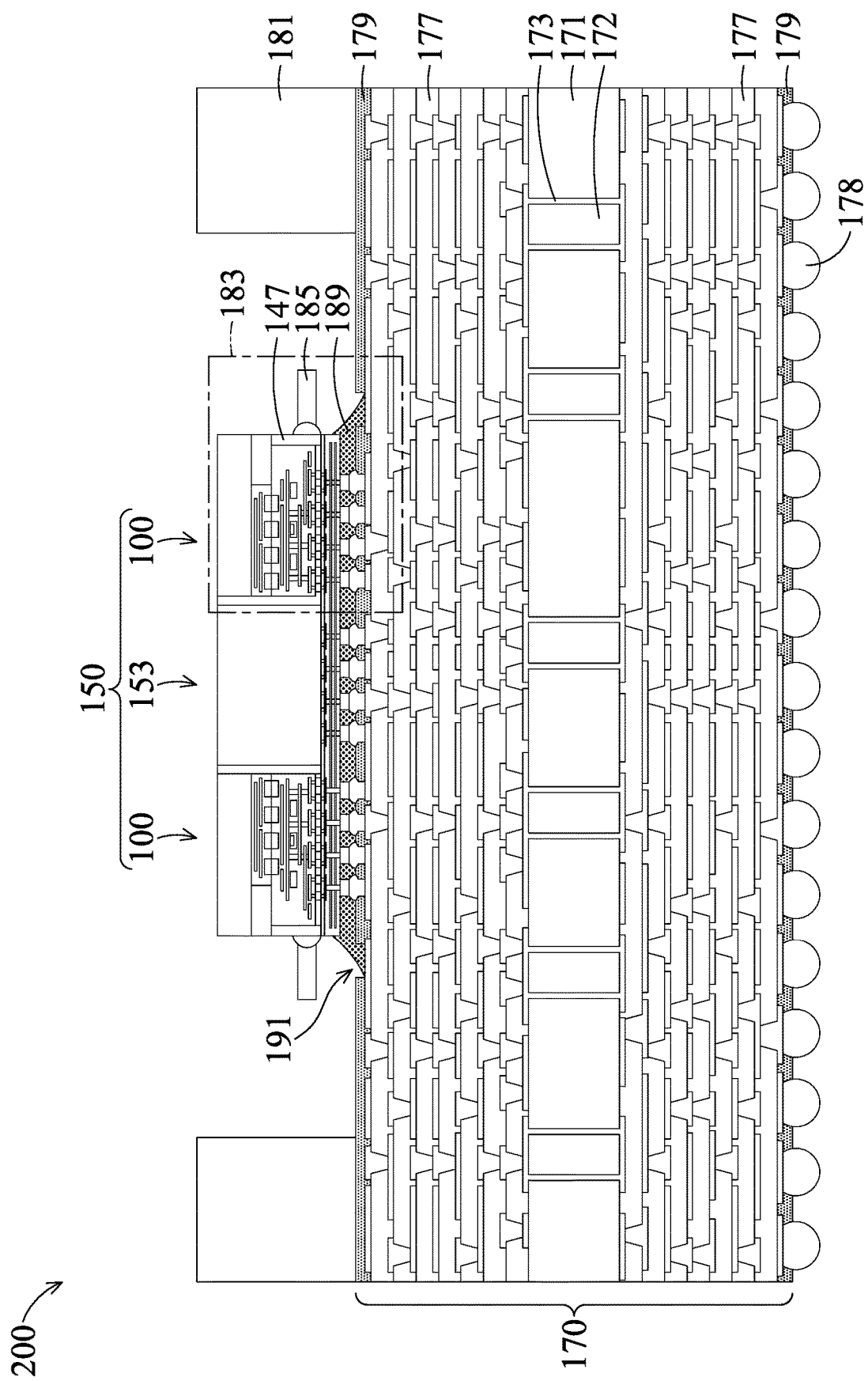
FIGS. 9A, 9B, 9C, 9D, and 9E illustrate various views of a semiconductor package, in accordance with an embodiment.

The optical glue 147 embedded in the photonic die 120 has better transparency (e.g., less optical loss) for optical signals than the dielectric layers 131/121 of the photonic die 120, thus is conducive to optical communication between the edge coupler 139 and, e.g., a horizontally mounted optical fiber (see, e.g., optical fiber 185 in FIG. 9A). In the example of FIG. 6, the optical glue 147 protrudes from the lower surface of the dielectric layer 131. A surface 147T of the optical glue 147 has a curved shape (e.g., a convex shape), which may be formed by overfilling of the trenches 13 by the optical glue 147.

When the horizontal distances between neighboring waveguides (e.g., 133, 137A, 137B, 137C) are small, e.g., when there is lateral overlapping, and also when the vertical distances between neighboring waveguides (e.g., 133, 137A, 137B, 137C) are small, light may optically inter-couple between the neighboring waveguides (e.g., 133, 137A, 137B, 137C). Accordingly, the light in the nitride waveguide 137A may be optically coupled to the overlying waveguide 133 through the nitride waveguides 137B and 137C, thereby forming the so-called "light via" (a vertical optical coupling path similar to the vertical electrical coupling path provided by a via). Therefore, a light signal from a horizontally mounted optical fiber (e.g., mounded to an exterior sidewall of the optical glue 147 next to the edge coupler 139) is able to be received by the edge coupler 139, then travel vertically through the "light via" and reach the photonic component 135 (e.g., a photodetector/modulator) embedded in the waveguide 133. The photonic component 135 performs the conversion between the optical signal and the electrical signal, which allows the electronic die 110 to process the electrical signal converted from the light signal.

FIG. 6 further illustrates the redistribution structure 129 of the photonic die 120. The redistribution structure 129 includes one or more dielectric layers 121 and conductive features (e.g., conductive lines 123 and vias 125) formed in the dielectric layers 121. Die connectors 127 (e.g., copper pillars, copper pads, or the like) of the photonic die 120 are formed at the upper surface of the photonic die 120 and are electrically coupled to the conductive features of the redistribution structure 129. In some embodiments, the dielectric layers 121 and 131 are formed of dielectric material (e.g., silicon oxide) that is substantially transparent to light at wavelengths suitable for transmitting optical signals. Note that the type of components, the number of components, the arrangement/configuration of the components illustrates in FIG. 6 is merely a non-limiting example, other types/ numbers of components, and other arrangement/configuration of the components are also possible, and are fully intended to be included within the scope of the present disclosure.

Figure 7:
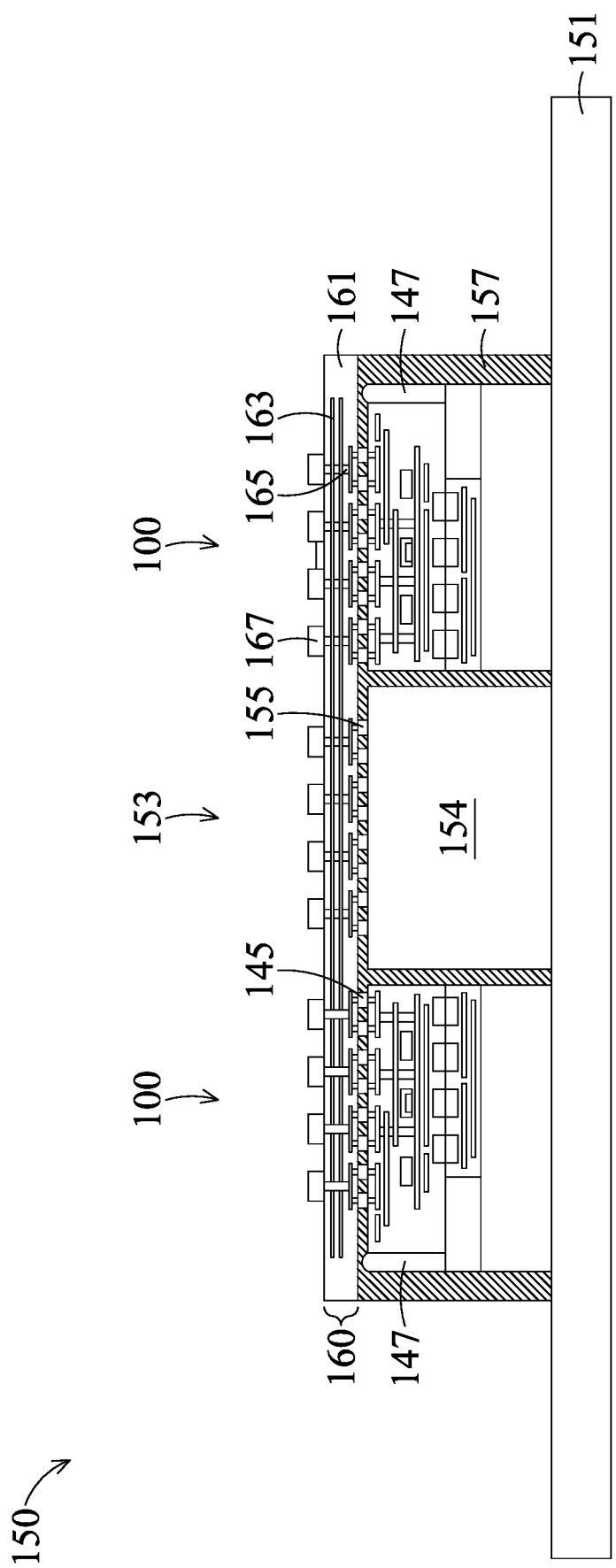
FIGS. 7 and 8 illustrate cross-sectional views of a semiconductor package at various stages of manufacturing, in accordance with an embodiment.
Figure 8:
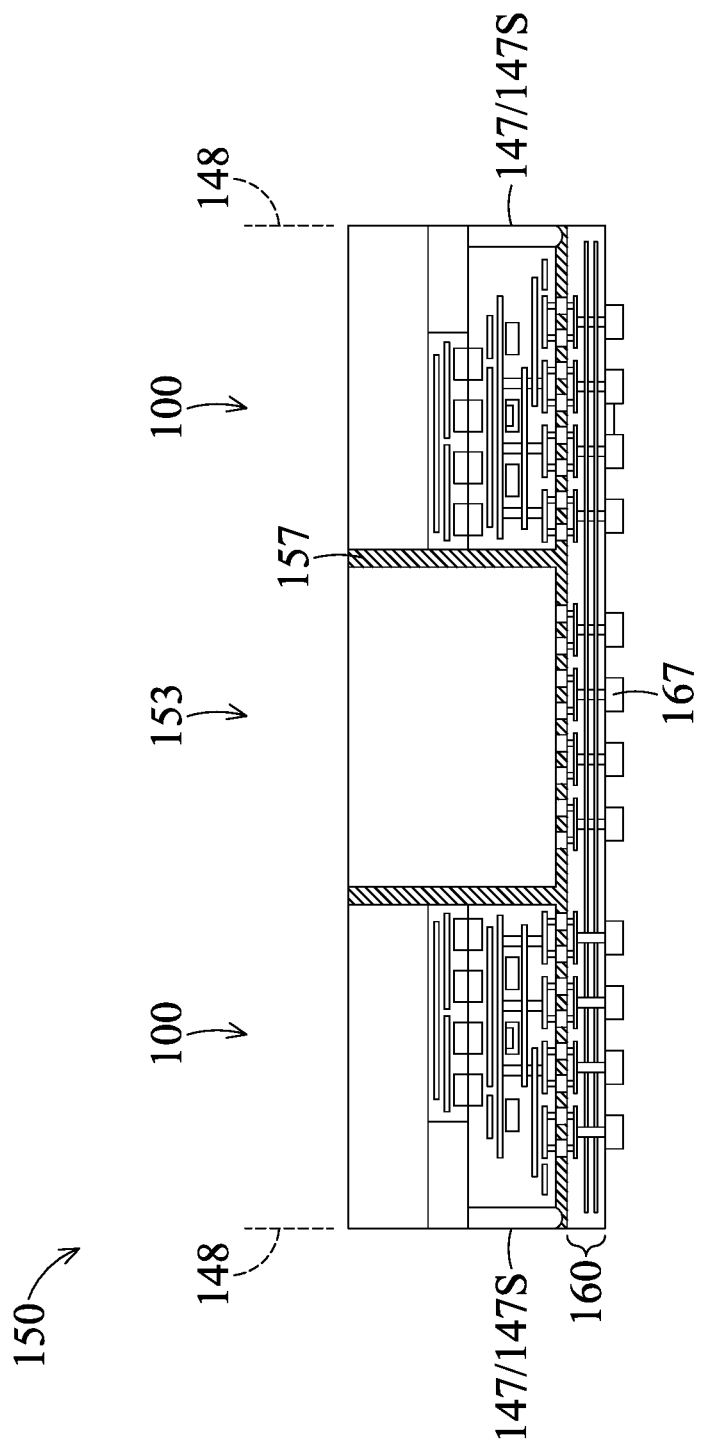

FIGS. 7 and 8 illustrate cross-sectional views of a semiconductor package 150 at various stages of manufacturing, in accordance with an embodiment.

In FIG. 7, two photonic packages 100 and an electronic die 153 are attached to a carrier 151. The carrier 151 may be, for example, a wafer (e.g., a silicon wafer), a panel, a glass substrate, a ceramic substrate, or the like. The photonic packages 100 and the electronic die 153 may be attached to the carrier 151 using, for example, an adhesive or a release layer (not shown). The electronic die 153 may be, e.g., a CPU, an application specific integrated circuit (ASIC), a high-bandwidth memory (HBM) die, or the like. The electronic die 153 may include a substrate 154, electronic components formed in and/or on the substrate 154, and interconnect structures connecting the electronic components to form functional circuits of the die. Die connectors 155 of the electronic die 153 provide electrical connection to the electronic die 153. Details are similar to those of the electronic die 110, thus not repeated. Note that the photonic packages 100 are positioned such that for each photonic package 100, the optical glue 147 is at an exterior sidewall (e.g., not facing the electronic die 153) of the photonic package 100, in order to facilitate coupling of an optical fiber to the optical glue 147 in subsequent processing.

Next, a molding material 157 is formed on the carrier 151 around the photonic packages 100 and the electronic die 153. The molding material 157 covers the exterior sidewalls of the optical glue 147 in the photonic packages 100. The molding material 157 may be cured by a curing process. After the molding material 157 is formed, a planarization process, such as chemical mechanical planarization (CMP), is performed to achieve a coplanar upper surface between the photonic packages 100, the electronic die 153, and the molding material 157.

Next, a redistribution structure 160 is formed over the molding material 157 and electrically coupled to the photonic packages 100 and the electronic die 153. In some embodiments, the redistribution structure 160 comprises one or more dielectric layers 161 and one or more layers of conductive features (e.g., conductive lines 163 and via 165) formed in the dielectric layers 161. In some embodiments, the one or more dielectric layers 161 are formed of a polymer, such as polybenzoxazole (PBO), polyimide, benzocyclobutene (BCB), or the like. In other embodiments, the dielectric layer 161 is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers 161 may be formed by any acceptable deposition process, such as spin coating, chemical vapor deposition (CVD), laminating, the like, or a combination thereof. The conductive features 163/165 may be formed of a suitable conductive material such as copper, titanium, tungsten, aluminum, or the like.

In some embodiments, the redistribution structure 160 is formed by: forming a dielectric layer 161 over the molding material 157, forming openings in the dielectric layer 161 to expose underlying conductive features, forming a seed layer over the dielectric layer 161 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. The above processing may be repeated multiple times until a target number of dielectric layers 161 and conductive features 165/163 are formed. Other ways to form the redistribution structure 160 are also possible, and are fully intended to be included within the scope of the present disclosure.

Next, conductive bumps 167 are formed over and electrically coupled to the redistribution structure 160. The conductive bumps 167 may be any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

As skilled artisans readily appreciate, a plurality of (e.g., identical) semiconductor packages 150 may be formed simultaneously (e.g., in the same processing steps) on the carrier 151. These semiconductor packages 150 will be separated by a subsequent dicing process to form individual, separate, semiconductor packages 150.

Next, in FIG. 8, the carrier 151 is removed by a carrier de-bonding process. The structure of FIG. 7 is flipped over, and the conductive bumps 167 are attached to a dicing tape (not shown). Next, a dicing process is performed along lines 148 to produce a plurality of individual (e.g., separate) semiconductor packages 150 as illustrated in FIG. 8.

The dicing process may be performed using a blade, or a laser cutting tool, as examples. The dicing is performed to cut through, or cut along, the optical glue 147, such that after the dicing process, the portions of molding material 157 that cover the exterior sidewalls 147S of the optical glue 147 are removed, and the exterior sidewalls 147S of the optical glue 147 are exposed, as illustrated in FIG. 8.

Figure 9B:
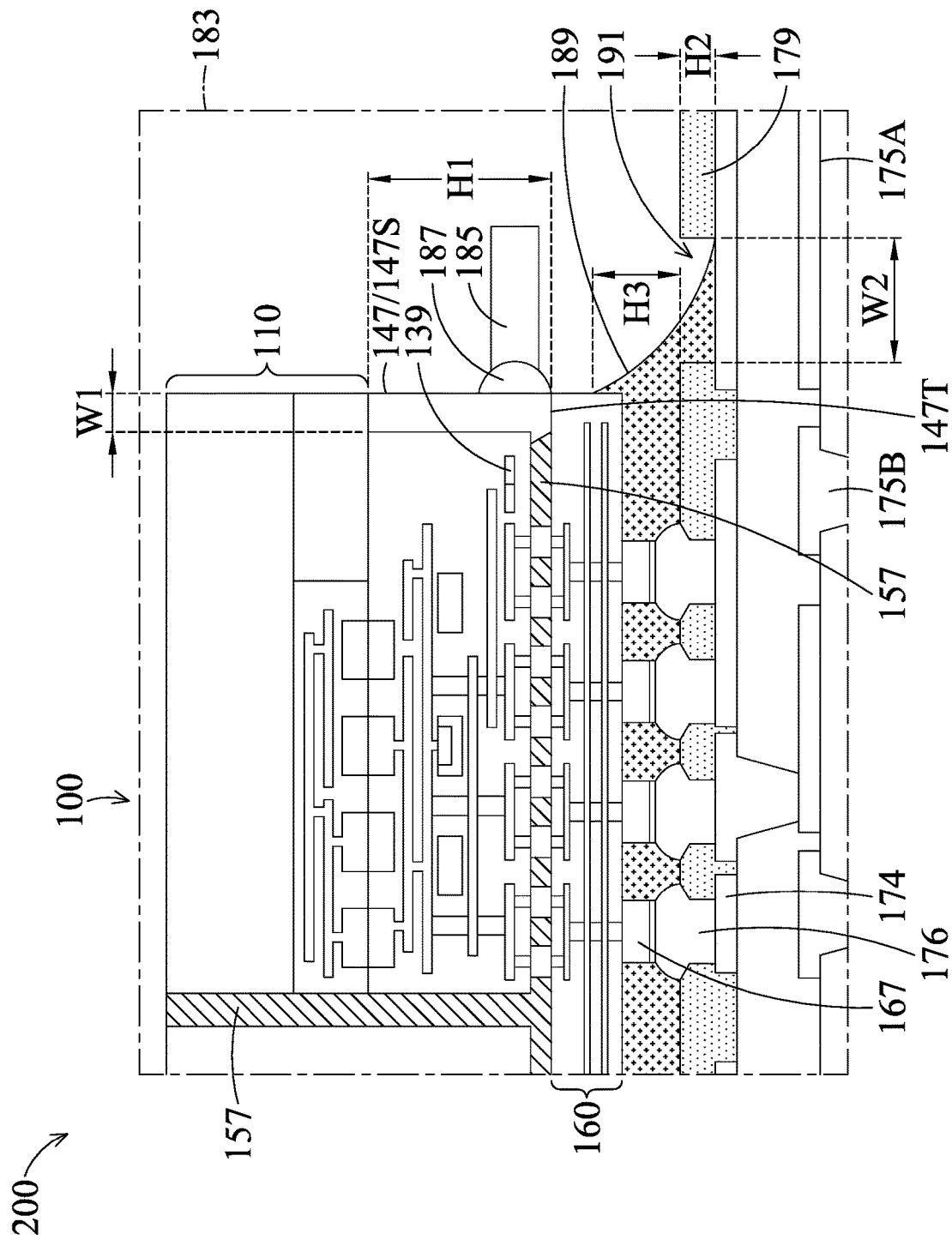

FIGS. 9A, 9B, 9C, 9D, and 9E illustrate various views (e.g., cross-sectional view, plan view) of a semiconductor package 200, in accordance with an embodiment. As illustrated in FIG. 9A, the semiconductor package 200 is formed by attaching (e.g., bonding) the semiconductor package 150 in FIG. 8 to a substrate 170. Next, an underfill material 189 is formed to fill the gap between the substrate 170 and the semiconductor package 150. FIG. 9B illustrates a zoomed-in view of an area 183 in FIG. 9A, which shows more details.

The substrate 170, which may be a printer circuit board (PCB), includes a dielectric core 171, which dielectric core is formed of a dielectric material such as prepreg, epoxy, silica filler, Ajinomoto build-up film (ABF), polyimide, molding compound, or the like, in some embodiments. In some embodiments, the dielectric core 171 includes bismaleimide triazine (BT) resin, FR-4 (a composite material composed of woven fiberglass cloth with an epoxy resin binder that is flame resistant), ceramic, glass, plastic, tape, film, or other supporting materials. Vias 173 are formed extending through the dielectric core 171. In some embodiments, the vias 173 are formed by drilling through-holes in the dielectric core 171, and forming (e.g., plating) a conductive material (e.g., copper) along sidewalls of the through-holes. After the conductive material are formed along the sidewalls of the through-holes, remaining portions of the through-holes may be filled with a dielectric material 172, as illustrated in the example of FIG. 9A.

Referring to FIGS. 9A and 9B, conductive features, such as conductive lines 175A, vias 175B, and conductive pads 174 (not labeled in FIG. 9A, but labeled in FIG. 9B), are formed on opposing sides of the dielectric core 171 and serve as redistribution layers to re-route electrical signals from a first location(s) of the substrate 170 to a second location(s) of the substrate 170. The conductive features are formed in a plurality of dielectric layers 177, which may be formed of a suitable dielectric material, such as ABF or prepreg. FIG. 9A further illustrates a topmost dielectric layer 179 and a bottommost dielectric layer 179 of the substrate 170. The topmost dielectric layer 179 and the bottommost dielectric layer 179 may be formed of, e.g., solder resist, as an example. Conductive pads 174 of the substrate 170 are exposed by openings in the topmost/bottommost dielectric layers 179. In some embodiments, the conductive bumps 167 of the semiconductor package 150 are aligned with respective conductive pads 174 (see FIG. 9B) of the substrate 170, and a reflow process is performed to bond the conductive bumps 167 to the respective conductive pads 174 through solder regions 176. As illustrated in FIG. 9B, the solder regions 176 completely fills these openings during the reflow process. Note that unlike the trenches 191 discussed hereinafter (where the underfill material 189 flows into), no underfill material 189 flows into these openings (since they are filled by the solder regions 176).

As illustrated in FIG. 9A, an optical fiber 185 is attached to the exterior sidewall of the optical glue 147 in the photonic package 100, and is optically coupled to the edge coupler 139 (see FIG. 9B) of the photonic package 100 to support optical communication between the photonic package 100 and an external device. FIG. 9A further illustrates a ring 181 attached to the upper surface of the substrate 170 around the semiconductor package 150 using, e.g., an adhesive (not shown). The ring 181 may be formed of a rigid material such as glass, metal, or the like, and may be used to provide structural support and to improve the planarity of the substrate 170. External connectors 178, such as solder balls, are formed at the lower surface of the substrate 170.

FIG. 9B is a zoomed-in view of an area 183 of FIG. 9A. As illustrated in FIG. 9B, the optical fiber 185 is horizontally mounted and is attached to the exterior sidewall 147S of the optical glue 147 by, e.g., an optical glue 187. The optical glue 187 may or may not be a same material as the optical glue 147. A height H1 of the optical glue 147 is between about 1 µm and about 787 µm, and a thickness W1 of the optical glue 147 is larger than 0 µm and smaller than about 5000 µm, in some embodiments.

In FIG. 9B, the surface 147T of the optical glue is a flat surface, and is level with the lower surface of the molding material 157. This flat surface 147T may be formed by the CMP process performed after forming the molding material 157 in FIG. 7. For example, if the surface 147T of the optical glue 147 in FIG. 6 protrudes further from the lower surface of the photonic die 120 than the conductive bumps 145, the CMP process performed for the molding material 157 in FIG. 7 also removes portions of the optical glue 147 to form the flat surface 147T in FIG. 9B. If, however, the surface 147T of the optical glue 147 in FIG. 6 is closer to the lower surface of the photonic die 120 than the lower surface of the conductive bumps 145 in FIG. 6, the CMP process performed for the molding material 157 in FIG. 7 may not reach the optical glue 147, and therefore, the surface 147T of the optical glue 147 may retain its shape of FIG. 6 in the final product (see FIG. 10), or may retain another shape after the molding material 157 reshapes the surface 147T (see FIG. 11).

Figure 9C:
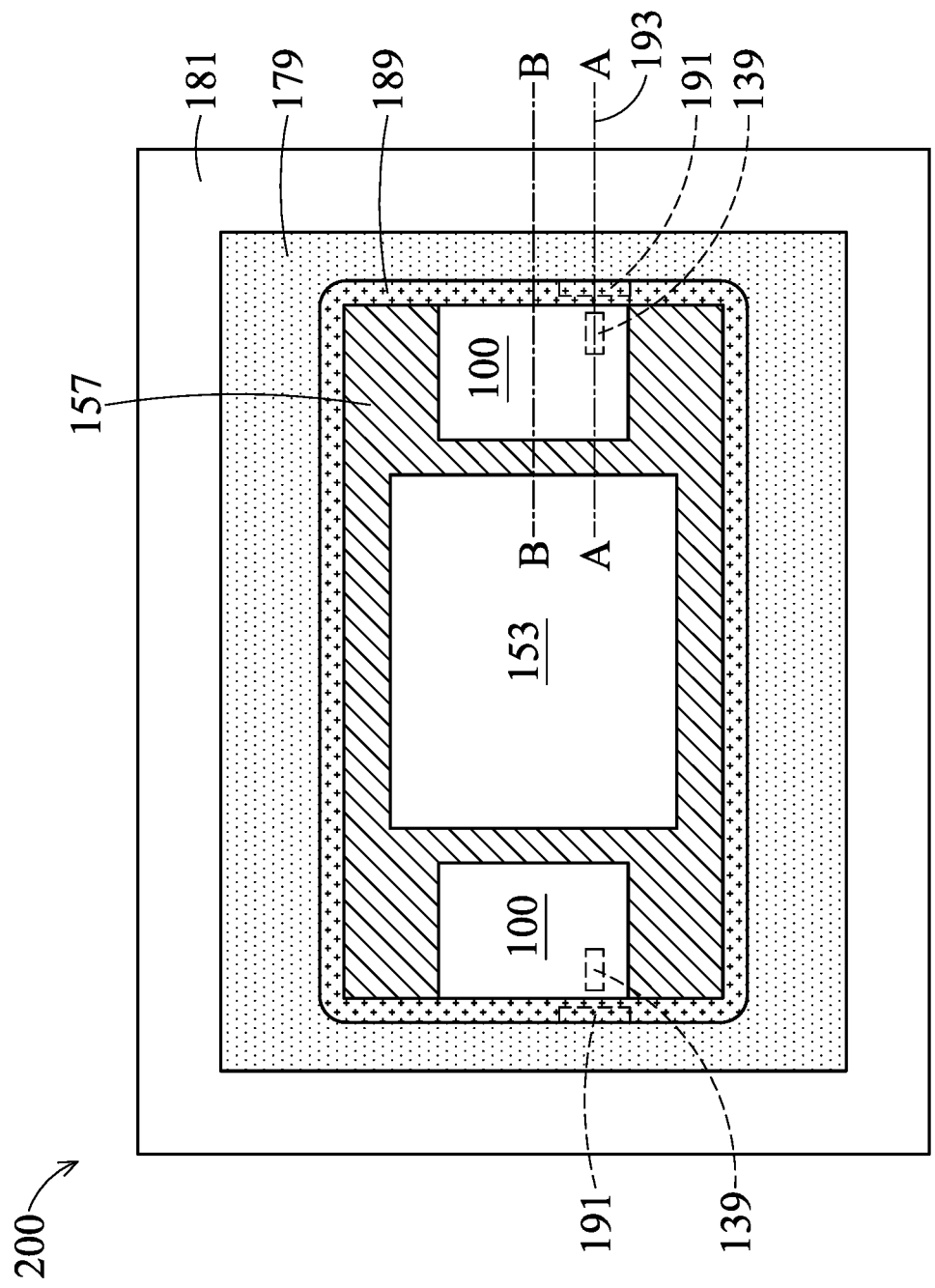
Figure 9D:
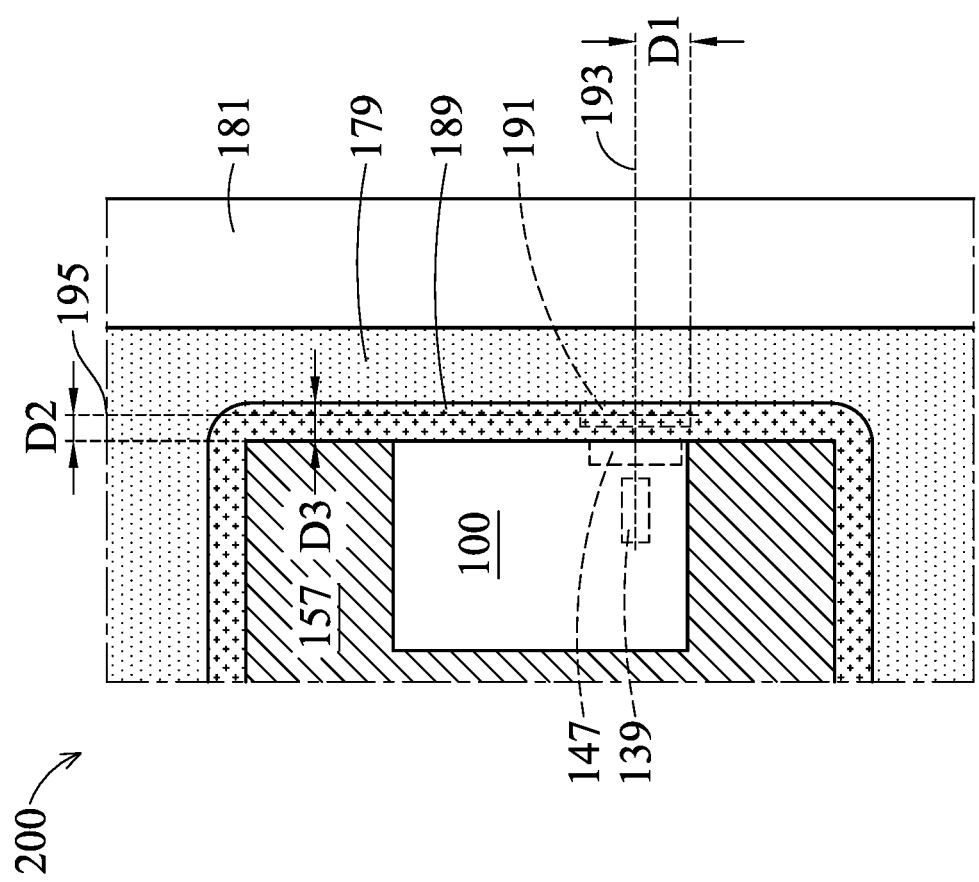

Notably, in FIG. 9B, a trench 191 is formed in the topmost dielectric layer 179 (e.g., a solder resist layer) at a location proximate to the optical glue 147. A width W2 of the trench 191 is between about 5 µm and about 100 µm, and a depth H2 of the trench 191 is between about 10 µm and about 30 µm, in some embodiments. FIGS. 9C and 9D further illustrate the location of the trench 191 relative to the photonic package 100, the optical glue 147, and the edge coupler 139, details of which are discussed hereinafter.

As illustrated in FIG. 9B, due to the trench 191, the underfill material 189 flows into the trench 191, thus reducing a height H3 of the fillet of the underfill material 189 measured between the upper surface of the topmost dielectric layer 179 of the substrate 170 and a topmost surface of the fillet of the underfill material 189 under (e.g., directly under) the optical glue 147. The H3 of the fillet of the underfill material 189 may be larger than 0 µm and smaller than about 100 µm, as an example. In FIG. 9B, the portion of the fillet of the underfill material 189 under the optical glue 147 covers (e.g., contacts and extends along) a lower sidewall of the redistribution structure 160 and exposes an upper sidewall of the redistribution structure 160. As a result, the exterior sidewall 147S of the optical glue 147 is completely exposed by (e.g., free of) the underfill material 189, which ensures that the exterior sidewall 147S of the optical glue 147 is free of obstruction for easy attachment of the optical fiber 185. In some embodiments, the optical fiber 185 is attached to a location of the exterior sidewall 147S such that the optical fiber 185 is pointed toward the edge coupler 139 for efficient optical coupling.

FIG. 9C shows a top view of the semiconductor package 200. For simplicity, not all features of the semiconductor package 200 are illustrated. FIG. 9C illustrates the photonic packages 100, the electronic die 153, and the molding material 157 in the semiconductor package 150. FIG. 9C also illustrates the fillet of the underfill material 189 around the sidewalls of the semiconductor package 150, the topmost dielectric layer 179 of the substrate 170, and the ring 181 around the semiconductor package 150. FIG. 9C further illustrates the edge couplers 139 of the photonic package 100, which are illustrated in phantom because they are not visible in the top view. In addition, the trenches 191 in the topmost dielectric layer 179 are also shown in phantom, because they may be covered by the underfill material 189. To avoid cluttering, FIG. 9C does not show the optical glue 147. FIG. 9D, which shows a zoomed-in view of a portion of FIG. 9C, further illustrates the optical glue 147 in the photonic package 100 in phantom. Therefore, FIG. 9C (or 9D), with the edge couplers 139, the trenches 191, and optical glue 147 shown, may also be referred to as a plan view of the semiconductor package 200.

As illustrated in FIG. 9C, the trench 191 is formed next to the edge coupler 139. In the top view of FIG. 9C, a center axis 193 (e.g., a longitudinal axis of the edge coupler 139/nitride waveguide 137) of the edge coupler 139 intersects (e.g., bisects) the trench 191. In an example embodiment, the trench 191 is positioned symmetrically around the center axis 193. The trench 191 is spaced apart from the right sidewall of the photonic package 100 (which is also the sidewall of the semiconductor package 150). FIG. 9C shows two lines A-A and B-B, where the line A-A overlaps with the center axis 193 of the edge coupler 139, and the line B-B is parallel to the line A-A, but does not insect the trench 191.

Figure 9E:
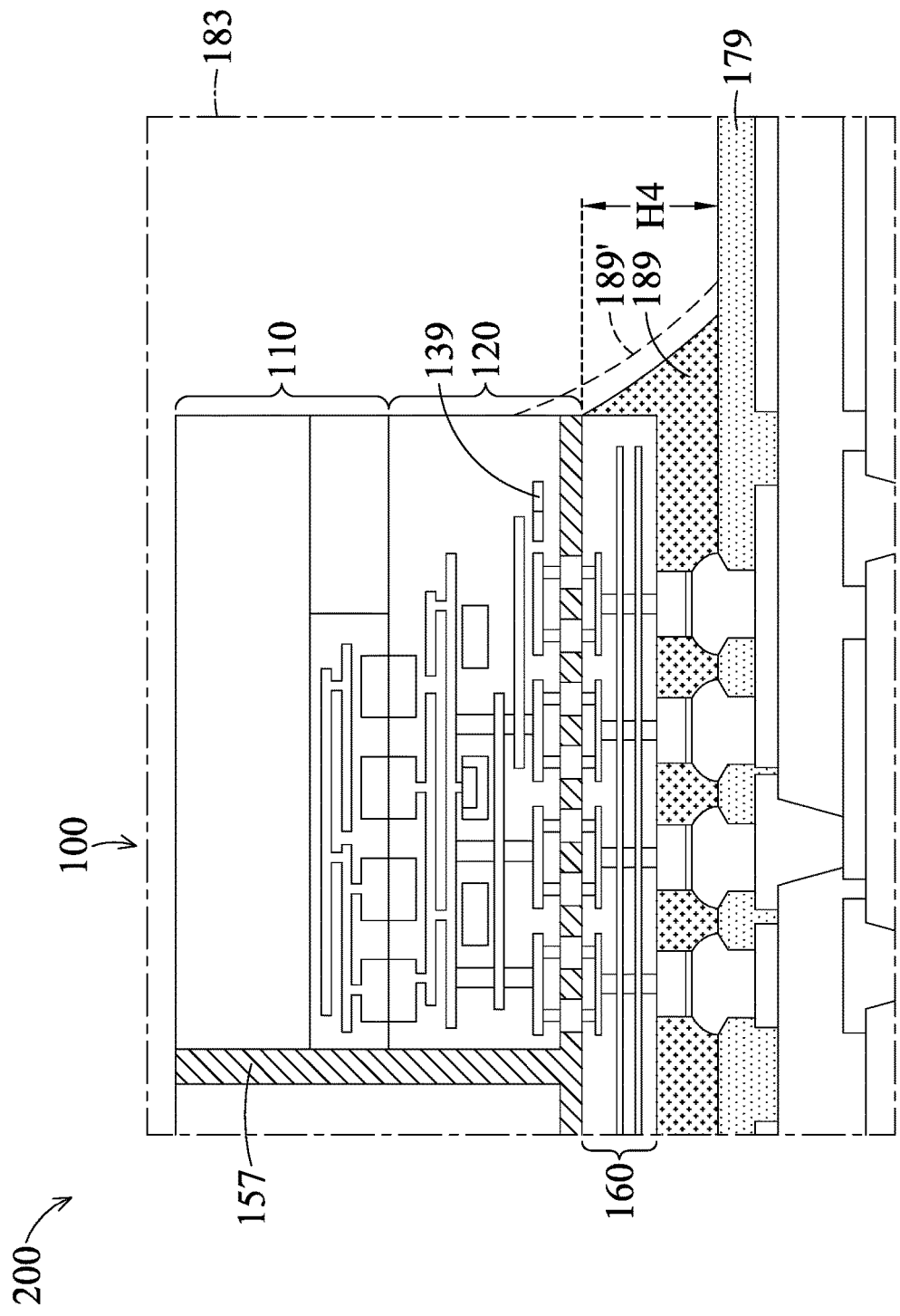

FIG. 9B is the cross-sectional view along line A-A, and FIG. 9E is the cross-sectional view along line B-B.

Referring now to FIG. 9D, which shows a zoomed-in view of a portion of FIG. 9C. Note that in FIG. 9D, the optical glue 147 in the photonic package 100 is shown in phantom. As illustrated in FIG. 9D, the exterior sidewall of the optical glue 147 overlaps (is flush) with the sidewall of the photonic package 100. In the example of FIG. 9D, the center axis 193 of the edge coupler 139 intersects (e.g., bisects) both the optical glue 147 and the trench 191. In some embodiments, a vertical offset D1 between the center axis 193 and the low sidewall of the trench 191 in FIG. 9D is between about 100 μm and about 5 mm. A width D3 of the fillet of the underfill material 189 may be between about 20 μm and about 5 mm. A horizontal offset D2 between a center axis 195 (e.g., a longitudinal axis of the trench 191 in FIG. 9D) of the trench 191 and a corresponding sidewall of the photonic package 100 facing the trench 191 is larger than 0 μm and smaller than about 2 mm, in some embodiments.

FIG. 9E is the cross-sectional view of the semiconductor package 200 along line B-B in FIG. 9C. The trench 191 in the topmost dielectric layer 179 of the substrate 170 is not in the cross-sectional view of FIG. 9E. Note that since there is no trench 191 formed in the portion of the topmost dielectric layer 179 shown in FIG. 9E, the fillet of the underfill material 189 shown in FIG. 9E (which is disposed outside the trench 191) extends higher along the sidewall of the redistribution structure 160 than the fillet of the underfill material 189 shown in FIG. 9B (which extends inside the trench 191). For example, the fillet of the underfill material 189 in FIG. 9E may completely cover the sidewall of the redistribution structure 160, as shown in FIG. 9E, or may even cover the lower sidewall of the photonic die 120, as shown by the dashed line 189' in FIG. 9E. In other words, without the trench 191, the fillet of the underfill material 189 in FIG. 9B may cover at least portion of the exterior sidewall of the optical glue 147, thus hindering the attachment of the optical fiber 185.

Figure 10:
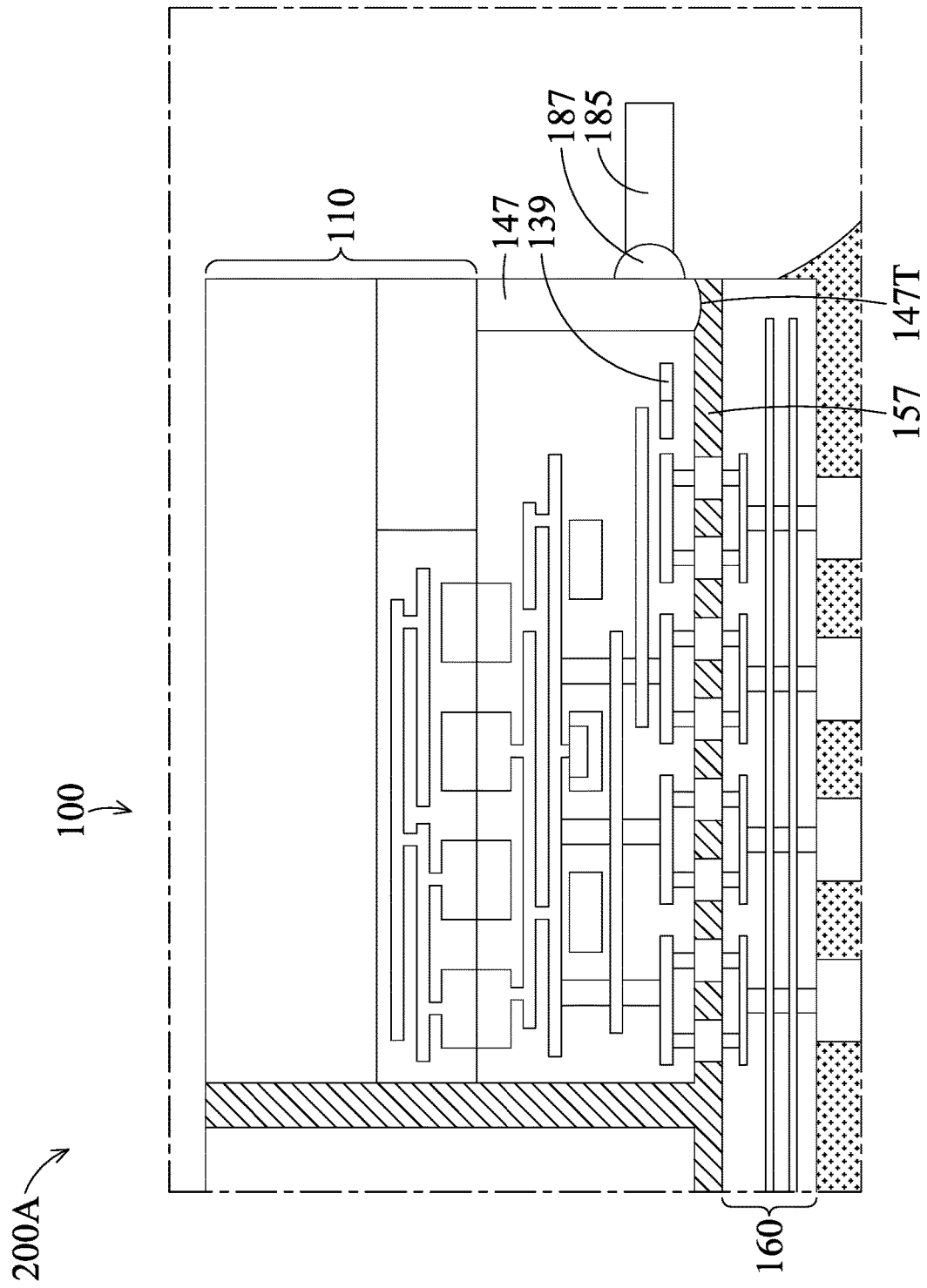
FIG. 10 illustrates a cross-sectional view of a semiconductor package, in accordance with another embodiment.

FIG. 10 illustrates a cross-sectional view of a portion of a semiconductor package 200A, in accordance with another embodiment. The semiconductor package 200A is similar to the semiconductor package 200 in FIG. 9B, but with a different shape for the surface 147T of the optical glue 147. In FIG. 10, the surface 147T of the optical glue 147 is recessed from the lower surface of the molding material 157, and is a curved (e.g., convex) surface. As discussed above, the shape of the surface 147T may retain its original shape in FIG. 6, if the CMP process for the molding material 157 does not reach the optical glue 147.

Figure 11:
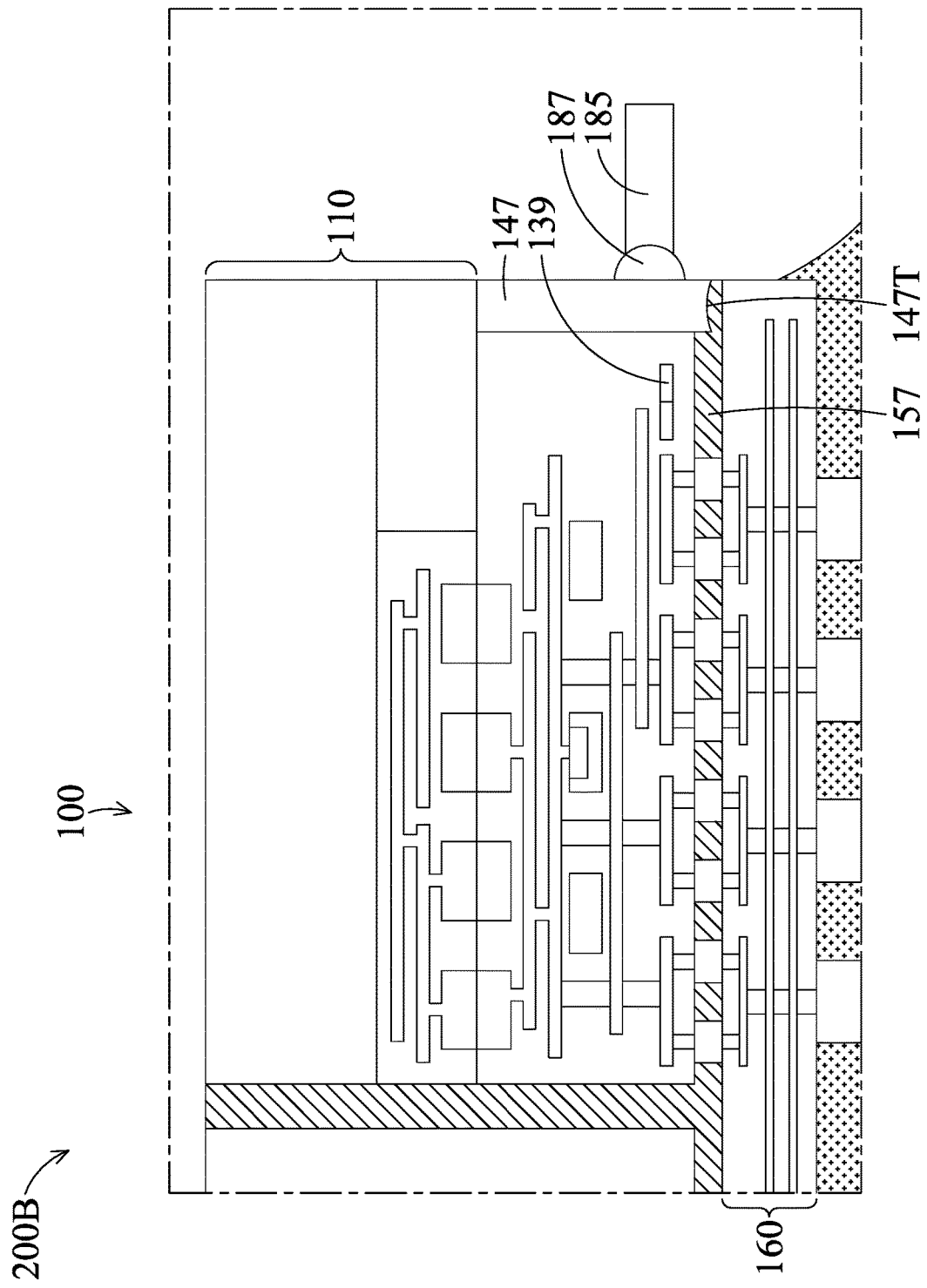
FIG. 11 illustrates a cross-sectional view of a semiconductor package, in accordance with another embodiment.

FIG. 11 illustrates a cross-sectional view of a portion of a semiconductor package 200B, in accordance with another embodiment. The semiconductor package 200B is similar to the semiconductor package 200 in FIG. 9B, but with a different shape for the surface 147T of the optical glue 147. In FIG. 11, the surface 147T of the optical glue 147 is recessed from the lower surface of the molding material 157, and is a curved (e.g., concave) surface. The concave shape for the surface 147T may be caused by formation of the molding material 157 and the thermal energy transferred to the optical glue 147 during formation of the molding material 157, which shapes or reshapes the surface 147T of the optical glue 147. The CMP process for the molding material 157 does not reach the optical glue 147, and therefore, does not produce the flat surface 147T as illustrated in FIG. 9B.

Figure 12A:
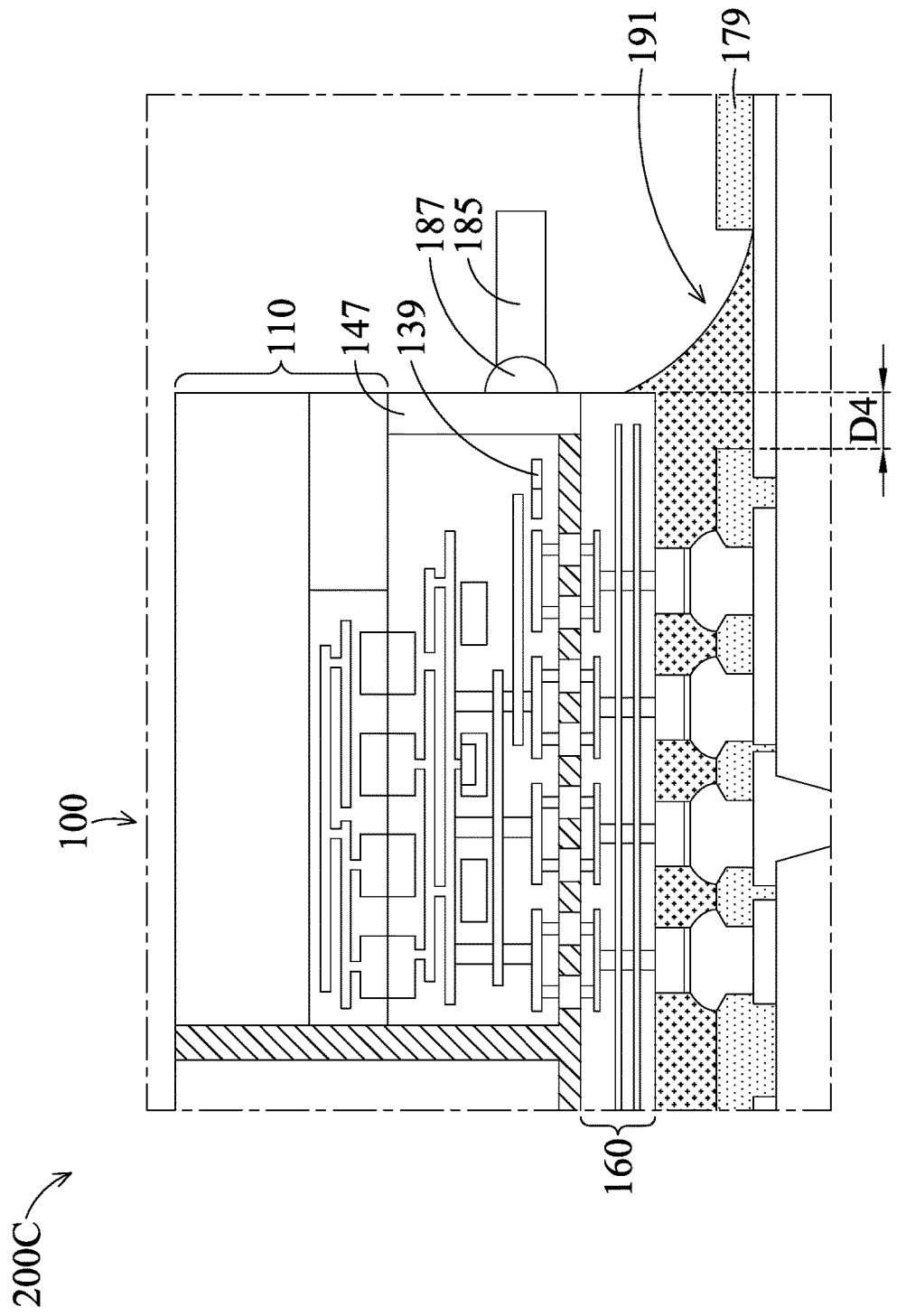
FIGS. 12A, 12B, and 12C illustrate various views of a semiconductor package, in accordance with another embodiment.
Figure 12B:
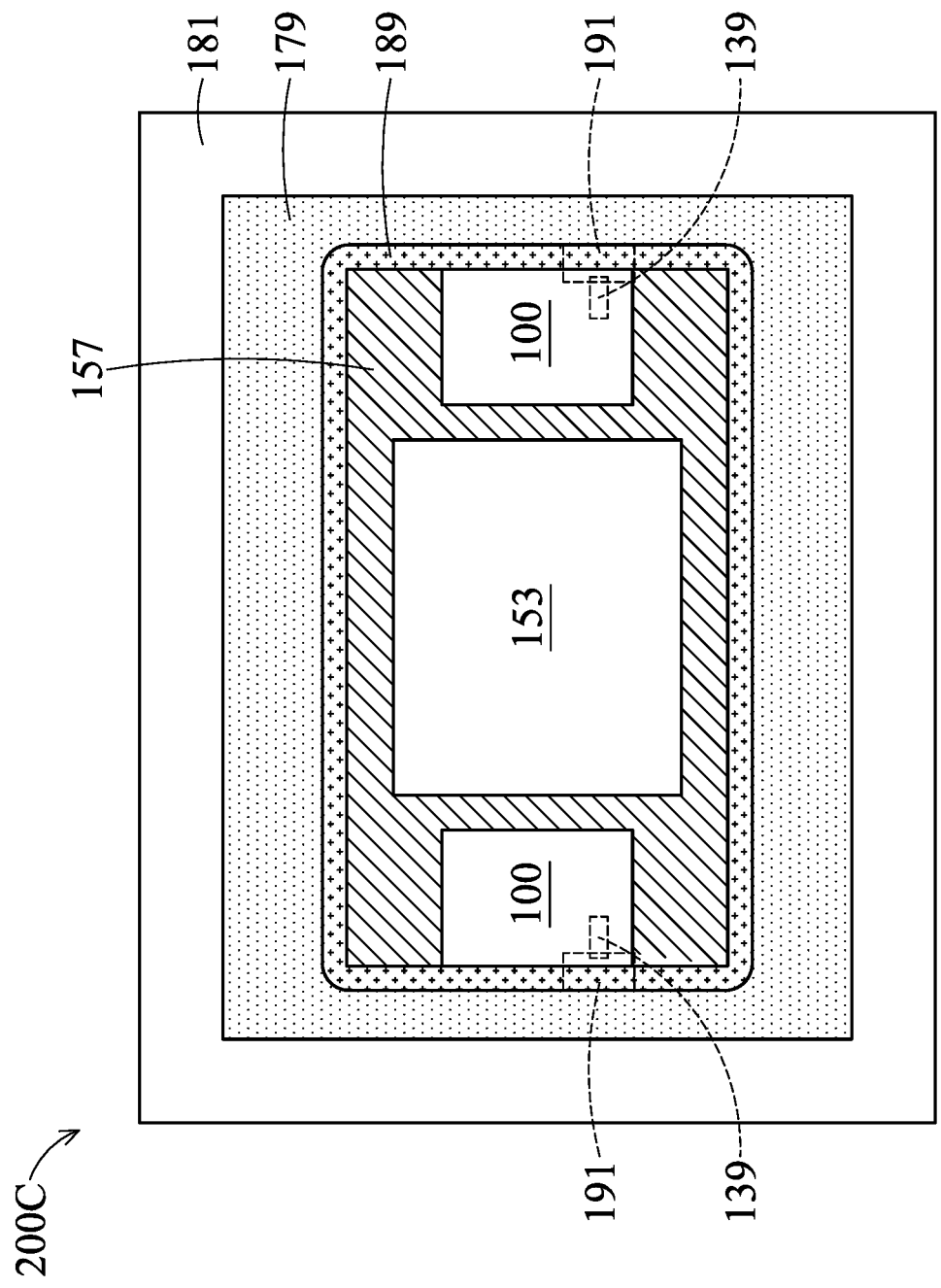
Figure 12C:
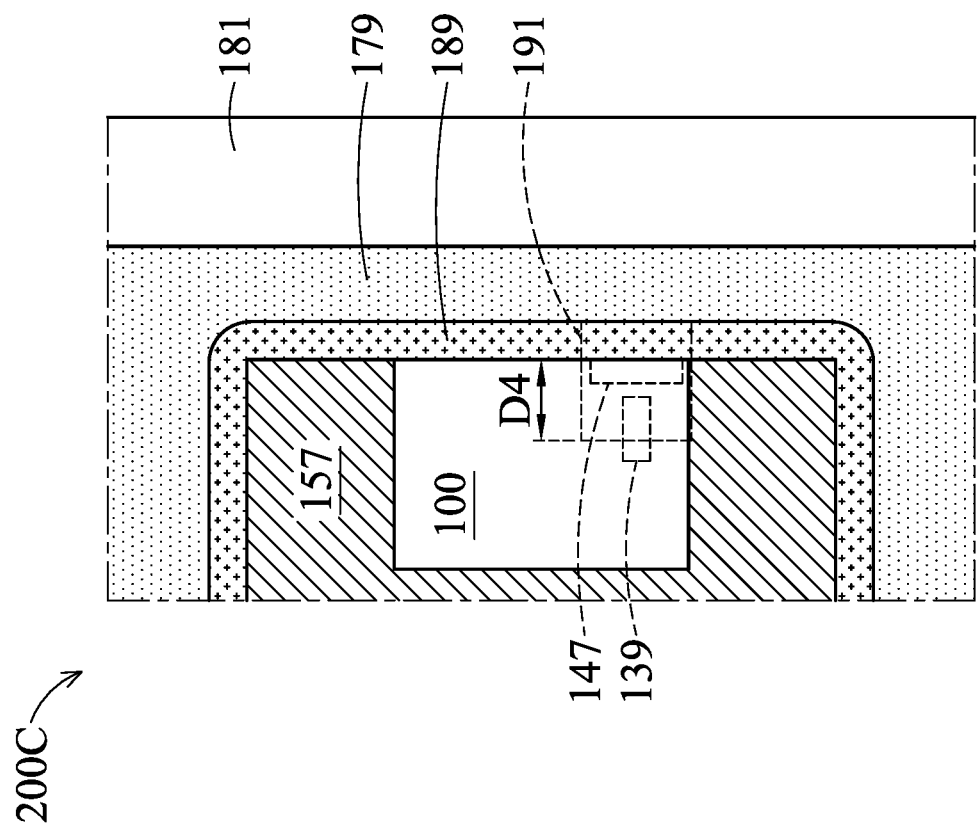

FIGS. 12A, 12B, and 12C illustrate various views of a portion of a semiconductor package 200C, in accordance with another embodiment. The semiconductor package 200C is similar to the semiconductor package 200 in FIG. 9B, but with the trench 191 extending under (e.g., directly under) the photonic package 100. Unlike FIG. 9B, where the trench 191 is disposed outside of the lateral extents of the photonic package 100, the trench 191 in FIG. 12A has a portion that is disposed within the lateral extents of the photonic package 100. In some embodiments, a first sidewall of the trench 191 is disposed within boundaries (e.g., defined by sidewalls) of the photonic package 100, and a second opposing sidewall of the trench 191 is disposed outside the boundaries of the photonic package 100. A lateral offset D4 between the first sidewall of the trench 191 and a respective sidewall (e.g., a closest sidewall) of the photonic package 100 is larger than 0 mm and smaller than 0.5 mm, in some embodiments.

FIG. 12B shows a top view of the semiconductor package 200C. The top view of the semiconductor package 200C is similar to that in FIG. 9C, but the trenches 191 extend into boundaries of the photonic package 100. FIG. 12C shows a zoomed-in view of a portion of FIG. 12B. The optical glue 147 is also shown in FIG. 12C in phantom. As illustrated in FIG. 12C, the trench 191 extends into boundaries of the photonic package 100, and may also overlap with at least portions of the edge coupler 139. FIG. 12C also illustrates the lateral offset D4 shown in FIG. 12A.

Figure 13:
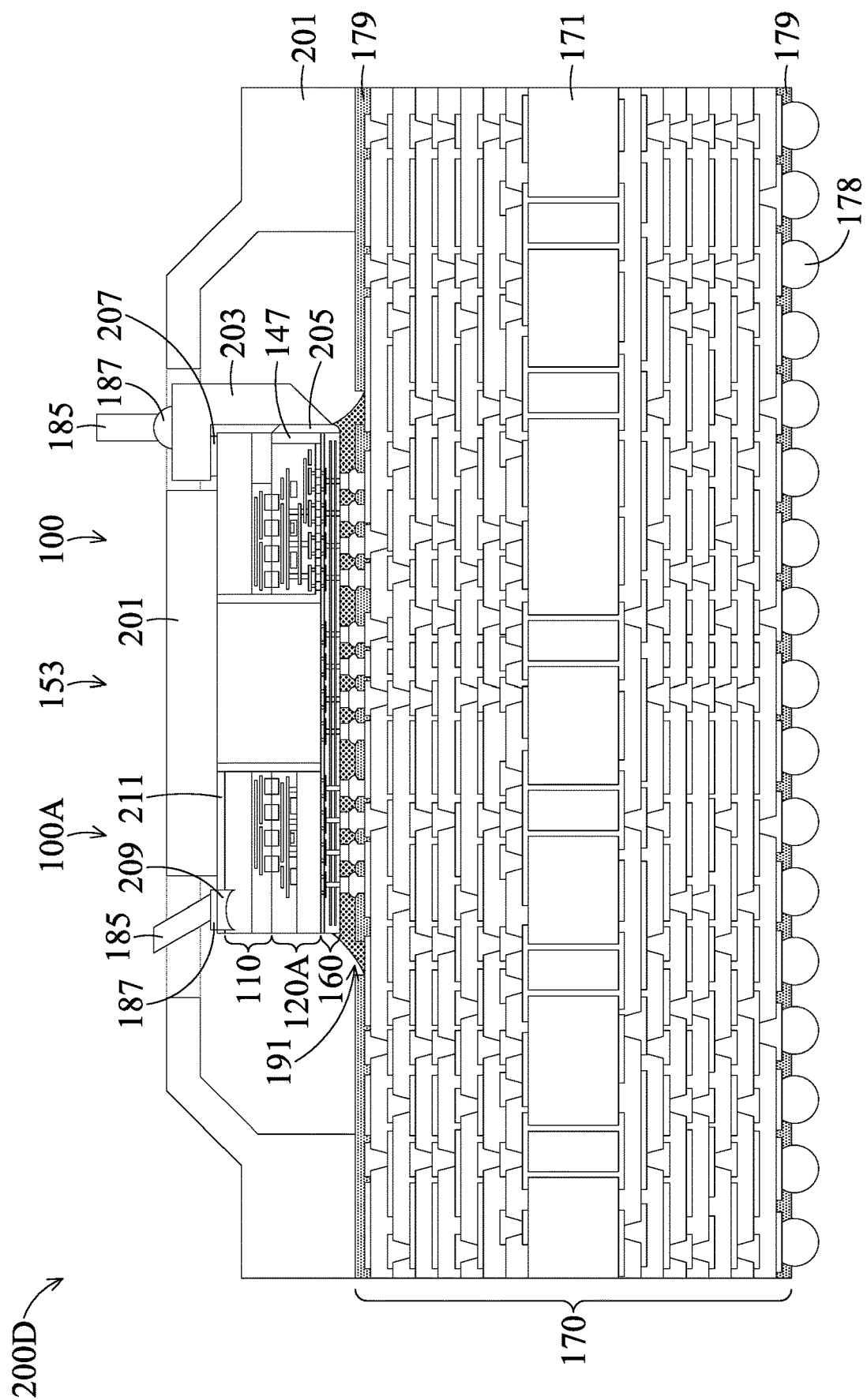
FIG. 13 illustrates a cross-sectional view of a semiconductor package, in accordance with another embodiment.

FIG. 13 illustrates a cross-sectional view of a semiconductor package 200D, in accordance with another embodiment. The semiconductor package 200D is similar to the semiconductor package 200 of FIG. 9A, but with one of the photonic packages 100 in FIG. 9A replaced by a photonic package 100A, and with the ring 181 in FIG. 9A replaced by a lid 201. The lid 201 has openings in its top portion to allow attachment of, e.g., optical fibers 185 to the photonic packages 100/100A. For example, a fiber array unit (FAU) 203 is attached to the photonic package 100 for optical coupling between a vertically mounted optical fiber 185 and the edge coupler 139 of the photonic package 100. Furthermore, another vertically mounted optical fiber 185 is attached to the photonic package 100A and is optically coupled to a photonic component (e.g., a grating coupler) of the photonic package 100A. The lid 201 may be attached to the substrate 170 by, e.g., an adhesive material. A center portion of the lid 201 may contact the photonic packages 100/100A and the electronic die 153, either directly or through a thermal interface material (TIM), in order to facilitate heat dissipation.

In some embodiments, the photonic package 100A similar to the photonic package 100 of FIG. 6, but with the nitride waveguides 137, the edge coupler 139, and the dielectric layers 131 in which the nitride waveguides 137 are formed replaced by a redistribution structure similar to the redistribution structure 129 of FIG. 6. In addition, a grating coupler may be integrated in the waveguides 133 of the photonic die of the photonic package 100A. FIG. 13 further illustrates a micro lens 209 formed in the substrate of the electronic die of the photonic package 100A. An optical fiber 185 is vertically mounted to the backside of the photonic package 100A over the micro lens 209 using an optical glue 187, and is optically coupled to the grating coupler in the waveguide 133 of the photonic die of the photonic package 100A.

The FAU 203 is attached to the backside of the photonic package 100 using an adhesive material 207, and to the exterior sidewall of the optical glue 147 using an optical glue 205. A vertically mounted optical fiber 185 is attached to an upper surface of the FAU 203 using an optical glue 187. The FAU 203 provides an interface to enable optical coupling between the edge coupler 139 of the photonic die of the photonic package 100 and the vertically mounted optical fiber 185 attached to the FAU 203.

Figure 14:
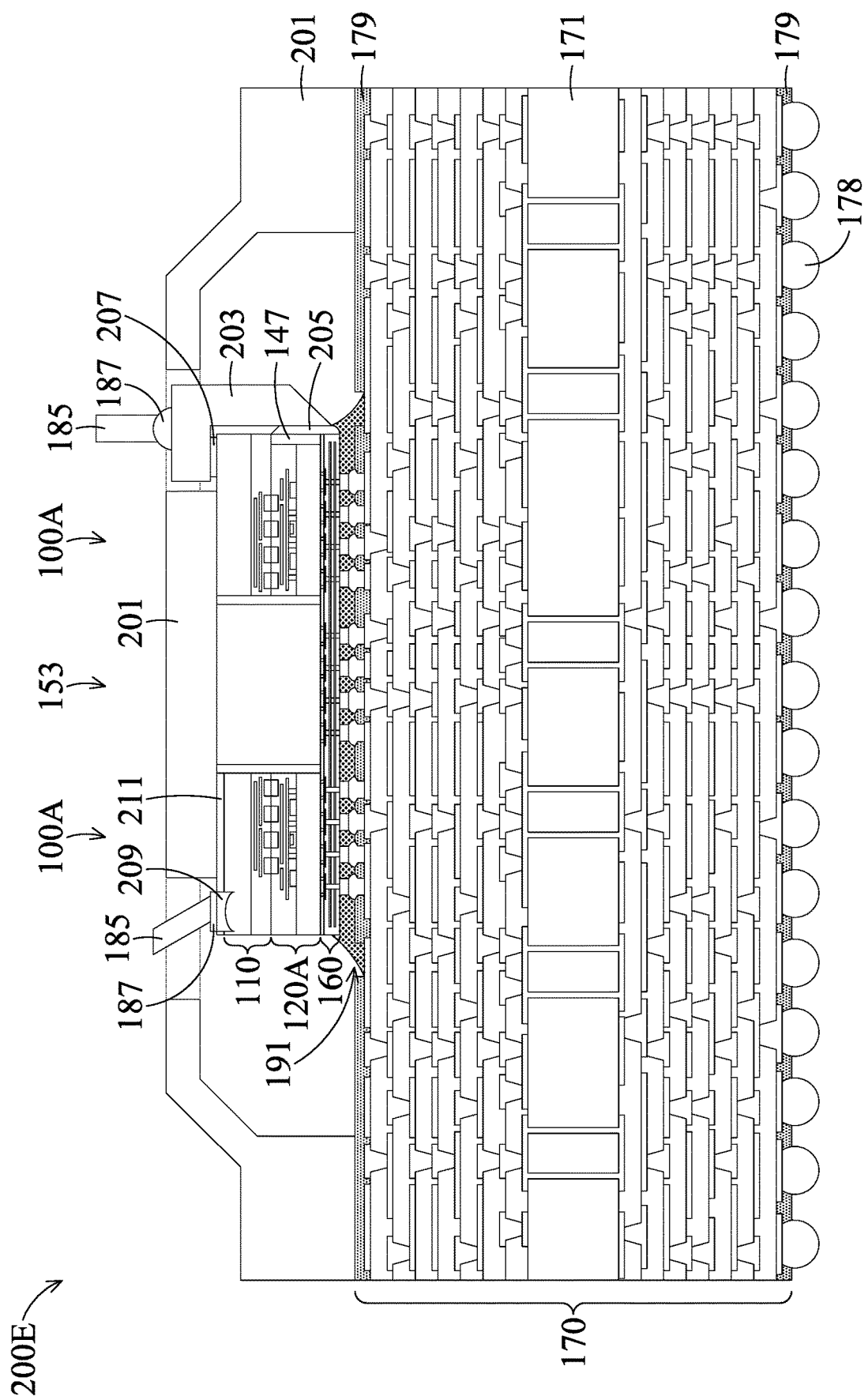
FIG. 14 illustrates a cross-sectional view of a semiconductor package, in accordance with yet another embodiment.

FIG. 14 illustrates a cross-sectional view of a semiconductor package 200E, in accordance with yet another embodiment. The semiconductor package 200E is similar to the semiconductor package 200D of FIG. 13, but with the photonic package 100 on the right also replaced by the photonic package 100A.

Embodiments may achieve advantages. For example, by embedding the optical glue 147 in the photonic die 120, the efficiency of optical coupling between the edge coupler 139 and the external optical fiber 185 is improved. In addition, the trench 191 in the substrate 170 ensures that the underfill material 189 does not extend high along the sidewall of the photonic package 100, and ensures that the exterior sidewall of the optical glue 147 is exposed for easy attachment of, or coupling to, optical fiber 185. The disclosed structure and method allow for optical coupling with both edge couplers 139 (e.g., through the optical glue 147 at the sidewall of the photonic package) and grating couplers (e.g., through a vertically mounted optical fiber) of the photonic packages, as illustrated in FIGS. 13 and 14. The disclosed semiconductor packages (e.g., 150, 200), by integrating both photonic dies and electronic dies in a same package, allows for co-package optics (CPO) integration, and achieves high bandwidth with ultra-low power consumption.

Figure 15:
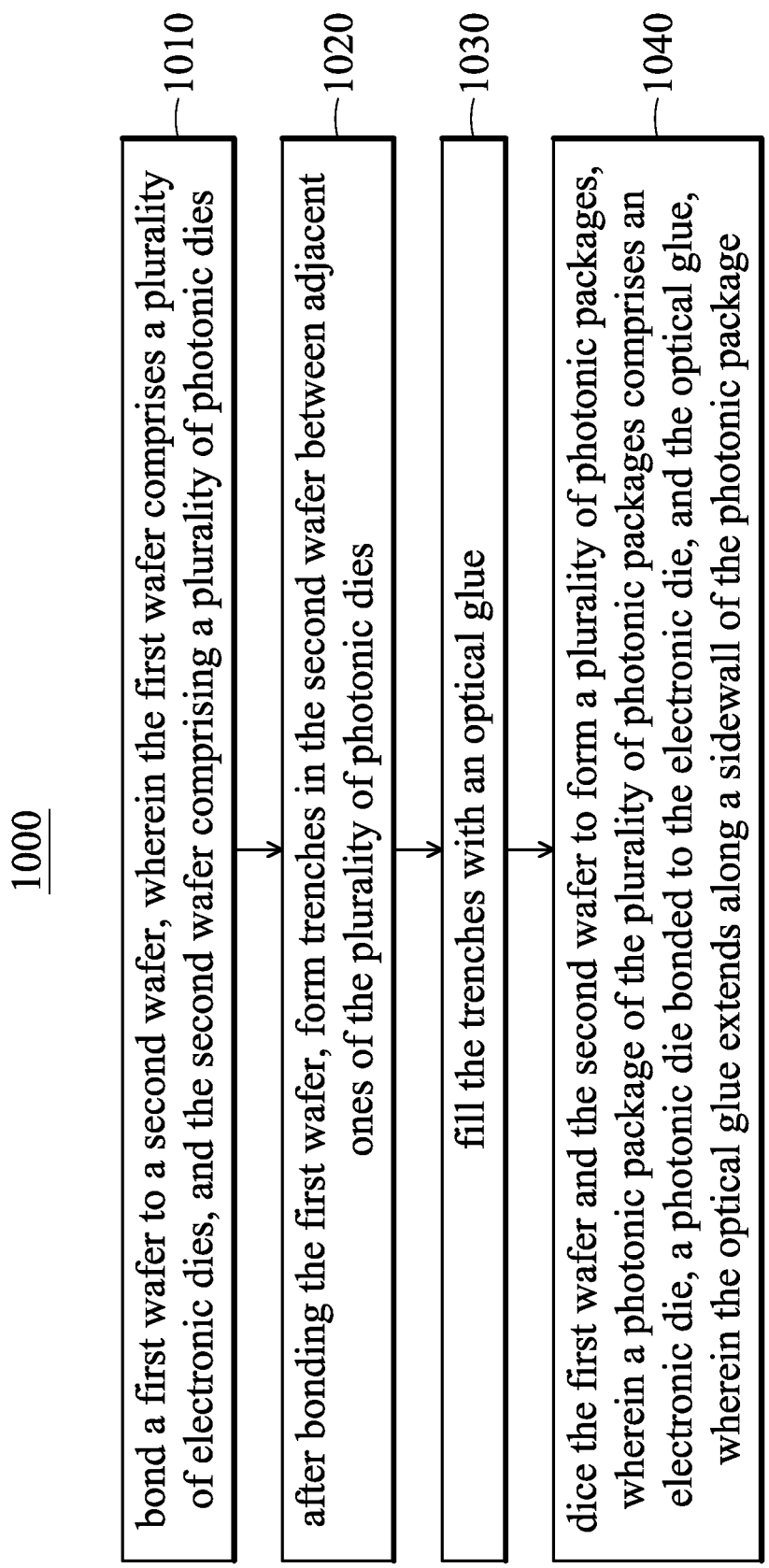
FIG. 15 illustrates a flow chart of a method of forming a semiconductor package, in accordance with an embodiment.

FIG. 15 illustrates a flow chart of a method 1000 of forming a semiconductor package, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged, or repeated.

Referring to FIG. 15, at block 1010, a first wafer is bonded to a second wafer, wherein the first wafer comprises a plurality of electronic dies, and the second wafer comprises a plurality of photonic dies. At block 1020, after bonding the first wafer, trenches are formed in the second wafer between adjacent ones of the plurality of photonic dies. At block 1030, the trenches are filled with an optical glue. At block 1040, the first wafer and the second wafer are diced to form a plurality of photonic packages, wherein a photonic package of the plurality of photonic packages comprises an electronic die, a photonic die bonded to the electronic die, and the optical glue, wherein the optical glue extends along a sidewall of the photonic package.

In accordance with an embodiment, a method of forming a semiconductor package includes: bonding a first wafer to a second wafer, wherein the first wafer comprises a plurality of electronic dies, and the second wafer comprises a plurality of photonic dies; after bonding the first wafer, forming trenches in the second wafer between adjacent ones of the plurality of photonic dies; filling the trenches with an optical glue; and dicing the first wafer and the second wafer to form a plurality of photonic packages, wherein a photonic package of the plurality of photonic packages comprises an electronic die, a photonic die bonded to the electronic die, and the optical glue, wherein the optical glue extends along a sidewall of the photonic package. In an embodiment, the first wafer has first dicing regions, and the second wafer has second dicing regions, wherein after bonding the first wafer to the second wafer, the first dicing regions are aligned with respective ones of the second dicing regions. In an embodiment, the trenches are formed along the second dicing regions. In an embodiment, the trenches are formed to extend through the second wafer. In an embodiment, an exterior sidewall of the optical glue of the photonic package is flush with the sidewall of the photonic package. In an embodiment, the photonic die comprises a first waveguide and an edge coupler optically coupled to the first waveguide, wherein the edge coupler is proximate to a first sidewall of the photonic die facing the optical glue. In an embodiment, the optical glue is formed to contact and extend along the first sidewall of the photonic die. In an embodiment, the method further includes: attaching the photonic package to a carrier; attaching a die to the carrier laterally adjacent to the photonic package; forming a molding material over the carrier around the photonic package and the die; and forming a first redistribution structure over and electrically coupled to the die and the photonic package. In an embodiment, the method further comprises, after forming the first redistribution structure, performing a dicing process, wherein the dicing process removes portions of the molding material and exposes the exterior sidewall of the optical glue. In an embodiment, the method further comprises: after performing the dicing process, attaching the first redistribution structure to a first side of a substrate; and forming an underfill material between the first redistribution structure and the substrate, wherein the underfill material exposes the exterior sidewall of the optical glue. In an embodiment, the method further comprises attaching an optical fiber to the exterior sidewall of the optical glue. In an embodiment, the substrate comprises: a dielectric core; a second redistribution structure at a first side of the dielectric core; and a solder resist layer over the second redistribution structure at the first side of the substrate, wherein there is a trench in the solder resist layer, wherein attaching the first redistribution structure comprises aligning the optical glue with the trench in the solder resist layer such that in a plan view, a center axis of the edge coupler intersects the optical glue and the trench in the solder resist layer.

In accordance with an embodiment, a method of forming a semiconductor package includes: attaching an photonic package and a semiconductor die to a carrier, wherein the photonic package comprises an electronic die, a photonic die bonded to the electronic die, and an optical glue embedded in the photonic die, wherein a first sidewall of the optical glue is flush with a sidewall of the electronic die; forming a molding material over the carrier around the photonic package and the semiconductor die, the molding material covering the first sidewall of the optical glue; forming a redistribution structure over the molding material; and after forming the redistribution structure, removing a portion of the molding material to expose the first sidewall of the optical glue. In an embodiment, the method further comprises, after removing the portion of the molding material: attaching the redistribution structure to a substrate; and forming an underfill material between the redistribution structure and the substrate. In an embodiment, the substrate comprises a dielectric core, a conductive feature extending along a first surface of the dielectric core, and a dielectric layer on the conductive feature, wherein there is a trench in the dielectric layer, wherein after attaching the redistribution structure, the optical glue is adjacent to the trench. In an embodiment, the photonic die comprises an edge coupler for optical communication, wherein the edge coupler is adjacent to a sidewall of the photonic die facing the optical glue, wherein after attaching the redistribution structure, the edge coupler, the optical glue, and the trench are aligned along a same line in a plan view. In an embodiment, the method further comprises, after forming the underfill material, optically coupling an external optical fiber to the edge coupler through the optical glue.

In accordance with an embodiment, a semiconductor package includes: a redistribution structure; a photonic package attached to a first side of the redistribution structure, the photonic package comprising an electronic die, a photonic die bonded to the electronic die, and an optical glue embedded in the photonic die, wherein a first sidewall of the optical glue is flush with a sidewall of the electronic die; a molding material on the first side of the redistribution structure, wherein the molding material partially surrounds the photonic package and exposes the first sidewall of the optical glue; a substrate attached to a second opposing side of the redistribution structure; and an underfill material between the substrate and the redistribution structure, wherein the underfill material exposes the first sidewall of the optical glue. In an embodiment, the substrate comprises a dielectric core, a conductive feature extending along a first surface of the dielectric core, and a dielectric layer on the conductive feature, wherein there is a trench in the dielectric layer. In an embodiment, the photonic die comprises an edge coupler for optical communication, wherein the edge coupler is adjacent to a sidewall of the photonic die facing the optical glue, wherein in a plan view, a center axis of the edge coupler intersects the optical glue and the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, the method comprising:
    bonding a first wafer to a second wafer, wherein the first wafer comprises a plurality of electronic dies, and the second wafer comprises a plurality of photonic dies;
    after bonding the first wafer, forming trenches in the second wafer between adjacent ones of the plurality of photonic dies;
    filling the trenches with an optical glue; and
    dicing the first wafer and the second wafer to form a plurality of photonic packages,
    wherein a photonic package of the plurality of photonic packages comprises an electronic die, a photonic die bonded to the electronic die, and the optical glue, wherein the optical glue extends along a sidewall of the photonic package.

2. The method of claim 1, wherein the first wafer has first dicing regions, and the second wafer has second dicing regions, wherein after bonding the first wafer to the second wafer, the first dicing regions are aligned with respective ones of the second dicing regions.

3. The method of claim 2, wherein the trenches are formed along the second dicing regions.

4. The method of claim 3, wherein the trenches are formed to extend through the second wafer.

5. The method of claim 1, wherein an exterior sidewall of the optical glue of the photonic package is flush with the sidewall of the photonic package.

6. The method of claim 5, wherein the photonic die comprises a first waveguide and an edge coupler optically coupled to the first waveguide, wherein the edge coupler is proximate to a first sidewall of the photonic die facing the optical glue.

7. The method of claim 6, wherein the optical glue is formed to contact and extend along the first sidewall of the photonic die.

8. The method of claim 6, further comprising:
    attaching the photonic package to a carrier;
    attaching a die to the carrier laterally adjacent to the photonic package;
    forming a molding material over the carrier around the photonic package and the die; and
    forming a first redistribution structure over and electrically coupled to the die and the photonic package.

9. The method of claim 8, further comprising, after forming the first redistribution structure, performing a dicing process, wherein the dicing process removes portions of the molding material and exposes the exterior sidewall of the optical glue.

10. The method of claim 9, further comprising:
    after performing the dicing process, attaching the first redistribution structure to a first side of a substrate; and
    forming an underfill material between the first redistribution structure and the substrate, wherein the underfill material exposes the exterior sidewall of the optical glue.

11. The method of claim 10, further comprising attaching an optical fiber to the exterior sidewall of the optical glue.

12. The method of claim 10, wherein the substrate comprises:
    a dielectric core;
    a second redistribution structure at a first side of the dielectric core; and
    a solder resist layer over the second redistribution structure at the first side of the substrate, wherein there is a trench in the solder resist layer, wherein attaching the first redistribution structure comprises aligning the optical glue with the trench in the solder resist layer such that in a plan view, a center axis of the edge coupler intersects the optical glue and the trench in the solder resist layer.

13. A method of forming a semiconductor package, the method comprising:
    attaching an photonic package and a semiconductor die to a carrier, wherein the photonic package comprises an electronic die, a photonic die bonded to the electronic die, and an optical glue embedded in the photonic die, wherein a first sidewall of the optical glue is flush with a sidewall of the electronic die;
    forming a molding material over the carrier around the photonic package and the semiconductor die, the molding material covering the first sidewall of the optical glue;
    forming a redistribution structure over the molding material; and
    after forming the redistribution structure, removing a portion of the molding material to expose the first sidewall of the optical glue.

14. The method of claim 13, further comprising, after removing the portion of the molding material:
    attaching the redistribution structure to a substrate; and
    forming an underfill material between the redistribution structure and the substrate.

15. The method of claim 14, wherein the substrate comprises a dielectric core, a conductive feature extending along a first surface of the dielectric core, and a dielectric layer on the conductive feature, wherein there is a trench in the dielectric layer, wherein after attaching the redistribution structure, the optical glue is adjacent to the trench.

16. The method of claim 15, wherein the photonic die comprises an edge coupler for optical communication, wherein the edge coupler is adjacent to a sidewall of the photonic die facing the optical glue, wherein after attaching the redistribution structure, the edge coupler, the optical glue, and the trench are aligned along a same line in a plan view.

17. The method of claim 16, wherein the method further comprises, after forming the underfill material, optically coupling an external optical fiber to the edge coupler through the optical glue.

18. A semiconductor package comprising:
a redistribution structure;
a photonic package attached to a first side of the redistribution structure, the photonic package comprising an electronic die, a photonic die bonded to the electronic die, and an optical glue embedded in the photonic die, wherein a first sidewall of the optical glue is flush with a sidewall of the electronic die;
a molding material on the first side of the redistribution structure, wherein the molding material partially surrounds the photonic package and exposes the first sidewall of the optical glue;
a substrate attached to a second opposing side of the redistribution structure; and
an underfill material between the substrate and the redistribution structure, wherein the underfill material exposes the first sidewall of the optical glue.

19. The semiconductor package of claim 18, wherein the substrate comprises a dielectric core, a conductive feature extending along a first surface of the dielectric core, and a dielectric layer on the conductive feature, wherein there is a trench in the dielectric layer.

20. The semiconductor package of claim 19, wherein the photonic die comprises an edge coupler for optical communication, wherein the edge coupler is adjacent to a sidewall of the photonic die facing the optical glue, wherein in a plan view, a center axis of the edge coupler intersects the optical glue and the trench.

* * * * *

UNITED STATES PATENT AND TRADEMARK OFFICE
CERTIFICATE OF CORRECTION

PATENT NO. : 12,334,362 B2
APPLICATION NO. : 18/150557
DATED : June 17, 2025
INVENTOR(S) : Wu et al.

Page 1 of 1

It is certified that error appears in the above-identified patent and that said Letters Patent is hereby corrected as shown below:

In the Claims

In Column 16, Line 25, Claim No. 10:
Change "material exposes the exterior sidewall of the optic al"
To --material exposes the exterior sidewall of the optical--

Signed and Sealed this
Twenty-sixth Day of August, 2025

Coke Morgan Stewart
*Acting Director of the United States Patent and Trademark Office*